(12) United States Patent
Inaishi et al.

(10) Patent No.: US 7,853,442 B2
(45) Date of Patent: Dec. 14, 2010

(54) PRINTED CIRCUIT BOARD DESIGN INSTRUCTION SUPPORT METHOD AND DEVICE

(75) Inventors: Hiromichi Inaishi, Kanagawa (JP); Hiroyuki Tanaka, Kanagawa (JP); Keisuke Fukuoka, Kanagawa (JP); Masahiro Yamawaki, Kanagawa (JP); Asako Ajimine, Kanagawa (JP)

(73) Assignee: Zuken Inc., Yokohama-Shi (JP)

( * ) Notice: Subject to any disclaimer, the term of this patent is extended or adjusted under 35 U.S.C. 154(b) by 0 days.

(21) Appl. No.: 10/575,758

(22) PCT Filed: Oct. 13, 2004

(86) PCT No.: PCT/JP2004/015045

§ 371 (c)(1), (2), (4) Date: Mar. 5, 2007

(87) PCT Pub. No.: WO2005/038675

PCT Pub. Date: Apr. 28, 2005

(65) Prior Publication Data

US 2008/0027701 A1    Jan. 31, 2008

(30) Foreign Application Priority Data

Oct. 15, 2003    (JP) .............................. 2003-354607

(51) Int. Cl.
*G06F 17/50*    (2006.01)
*G06G 7/62*    (2006.01)

(52) U.S. Cl. .............................. 703/13; 703/14; 703/15

(58) Field of Classification Search .................. 703/13, 703/14
See application file for complete search history.

(56) References Cited

U.S. PATENT DOCUMENTS

2005/0071715 A1 *   3/2005   Kolman ....................... 714/724

FOREIGN PATENT DOCUMENTS

| JP | 9-26989 A | 1/1997 |
|---|---|---|
| JP | 9-288690 A | 11/1997 |
| JP | 2000-187680 A | 7/2000 |
| JP | 2001-282882 A | 10/2001 |
| JP | 2002-99583 A | 4/2002 |

OTHER PUBLICATIONS

Geppert, "IC Design on the World Wide Web" Jun. 1998. IEEE.*
Kundert, "Power Supply Noise Reduction", The Designer Guide Community Version 4, Jan. 2004.*

* cited by examiner

*Primary Examiner*—Kamini S Shah
*Assistant Examiner*—Saif A Alhija
(74) *Attorney, Agent, or Firm*—Birch, Stewart, Kolasch & Birch, LLP

(57) ABSTRACT

There are provided a printed circuit board design instruction support method between a circuit design and a printed circuit board design, a printed circuit board design instruction support device between a circuit design and a printed circuit board design, a Web system, a program, an a computer-readable recording medium which improve the work efficiency of the printed circuit board designing and the quality of the printed circuit board design. By selecting a circuit part to which the design rule is applied, a circuit program and a portion-to-be-checked on the printed circuit board are simultaneously displayed by cooperation between the circuit design system and the printed circuit board design system, thereby reducing the time and labor required for check.

17 Claims, 19 Drawing Sheets

FIG. 2

| | | | CIRCUIT BOARD DESIGN SIDE (1) | | PCB-DR RECORD (1) | | |
|---|---|---|---|---|---|---|---|
| No. | DESIGN INSTRUCTION | KEYWORD | ITEM | BEFORE DR | COMMENT BEFORE DR | CHECK RESULT | COMMENT | ASSOCIATED FILE |
| 1 | ①接置はG | CLOCK NET | | | | | | |
| | | | AY_CHCLK | | | | | |
| | | | GUARD_CL | | | | | |
| | | | AY_AUDDAT2 | | | | | |
| | | | GUARD_DA | | | | | |
| | | | BLUE | | | | | |
| | | | SG00148 | | | | | |
| 2 | 、スタブ | CLOCK NET | | | | | | |
| 3 | と最短距 | ⓢ BYPASS CAPACITOR | | | | | | |

PRINTED CIRCUIT BOARD DESIGN INSTRUCTION SUPPORT DEVICE

FILE(E) DISPLAY(V) COMMUNICATION(X) HELP(H)

| CHECK DATE | PERSON IN CHARGE OF CHECK | CHECK RESULT |
|---|---|---|
| 2003/3/25 | zuken | OK |

*FIG. 4(a)*

| CHECK RESULT | ▶ |
|---|---|
| OK | |
| CHECK AGAIN | |
| RECONSIDERATION REQUIRED | |

EXAMPLE)

DESIGN INSTRUCTION

| DESIGN INSTRUCTION | KEYWORD | ITEM |
|---|---|---|
| SET DESIGN INSTRUCTION FOR CLOCK LINE WIRING | CLOCK LINE | CLK001,CLK002 ... |

EXTRACTION CONDITION

| KEYWORD | EXTRACTION CONDITION |
|---|---|
| CLOCK LINE | SUCH AS: WIRINGS WHOSE WIRING NAME BEGINS WITH CLK, OR··· |

FIG. 10
CHECK OF DRAWING AROUND WIRINGS
"Net1" – "GND"
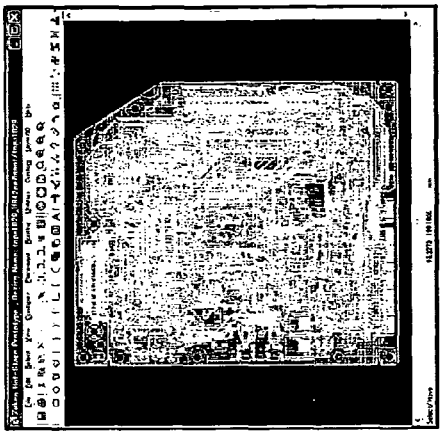
Pre Script [FULL-SCREEN DISPLAY/ALL-LAYERS DISPLAY]
[SELECTING ITEMS TO BE HIGHLIGHTED]
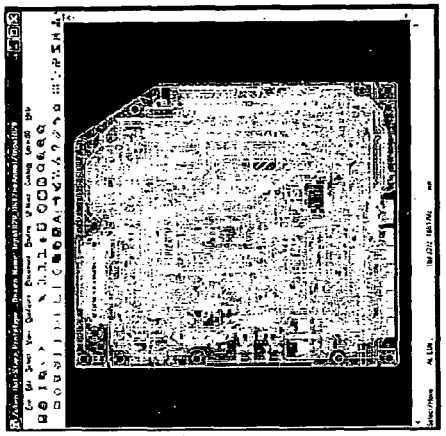
Post Script [SPECIFYING DISPLAY OF LAYER TO BE CHECKED/REGION]
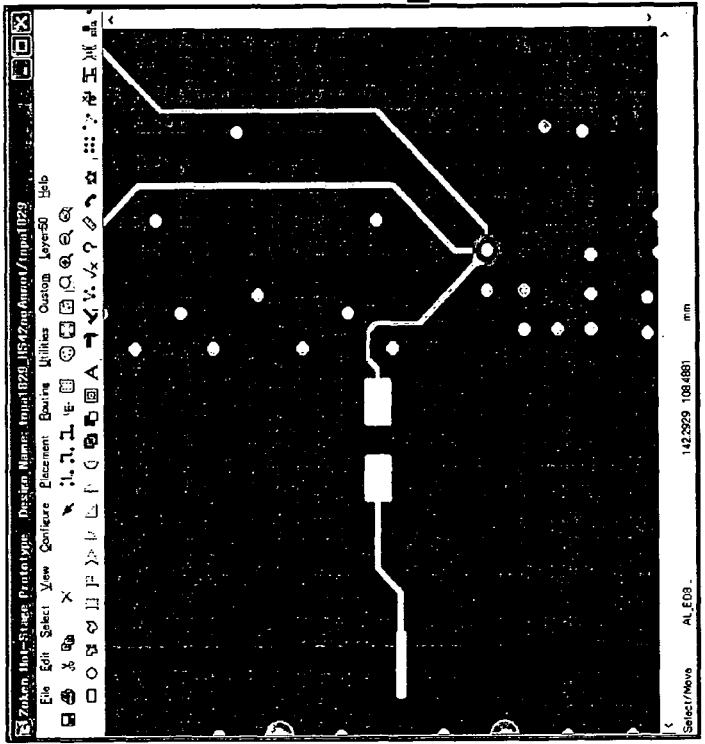

PRINTED CIRCUIT BOARD DESIGN INSTRUCTION SUPPORT METHOD AND DEVICE

TECHNICAL FIELD

The present invention relates to a printed circuit board design instruction support method between a circuit design and a printed circuit board design, a printed circuit board instruction support device between a circuit design and a printed circuit board design, a Web system, a program, and a computer-readable recording medium, more specifically to a printed circuit board design instruction support method between a circuit design and a printed circuit board design, a printed circuit board instruction support device between a circuit design and a printed circuit board design, a Web system, a program, and a computer-readable recording medium, which are designed to improve the work efficiency of the printed circuit board design and to improve the quality of the printed circuit board design.

BACKGROUND TECHNOLOGY

Conventionally, in creating a design instruction to design a printed circuit board on a circuit design step, a circuit designer has been supposed to write the design instruction in handwriting, and instruction required in designing has been communicated from the circuit designer to a printed circuit board designer by passing the completed design instruction to the printed circuit board designer.

Herein, the design instruction describes which portion of a circuit diagram should fall under the instruction, and in such occasion, the circuit designer was supposed to add items such as the names of parts and wirings (parts location "reference", part numbers, net names, etc.) to the design instruction in handwriting.

However, instruction was not fully communicated in communication operation by such a design instruction, and further, in the case where the circuit diagram was changed, the names of parts and wirings described on the design instruction needed to be changed in accordance with the change of circuit diagram.

For this reason, in the above-described conventional method, writing and changing work to the design instruction became complicated, and there was a possibility of miswriting the names of parts and wirings, and furthermore, there was the first problem that a problem occurred or quality was deteriorated due to insufficient communication on written instruction.

Further, regarding the design quality of a designed printed circuit board, a design instruction itself depends on designers, so that its quality varies according to the skill of designers, and there was the second problem that instruction contents were affected by instruction designers such that printed circuit board design quality is deteriorated due to human-dependent situation.

Meanwhile, there is known a resistance called a damping resistance with several tens $\Omega$, which is serially inserted into a signal line for the purpose of removing noise from reflected waves, and such a damping resistance is frequently used for the output of a buffer circuit, the output of a driving IC for a memory, or the like.

Conventionally, in extracting a damping resistance from the circuit diagram, attribute of the resistance, information of a connected item, connection status and the like have been visually confirmed on the circuit diagram. Specifically, there are many areas where the damping resistance must be extracted from the circuit diagram visually, and it was difficult to judge by anyone but the designer himself/herself.

Then, in designing printed circuit board, although it is necessary to instruct which resistance is the damping resistance by using the position and the wiring method of damping resistance as a circuit board design instruction, enormous time was required in extracting the damping resistance because no condition existed in extracting the damping resistance.

In short, the design instruction for the damping resistance is necessary in designing printed circuit board and checking printed circuit board, but there was the third problem that enormous time was required in extracting the damping resistance itself.

Furthermore, the number of LSIs to be mounted increases as a circuit size becomes larger, and the increase of LSIs directly connected to the increase of the number of bypass capacitors.

With the increase of the bypass capacitors, there was the fourth problem that much labor and time cost was consumed in recognizing as many as several hundred bypass capacitors, for example, by using a screen of CAD system and a drawing of layout, which was drawn on paper.

The bypass capacitors are classified by functions caused by the use methods (parts to be connected) of the capacitors, and the bypass capacitors cannot be judged on single capacitors.

To extract the bypass capacitors from the circuit diagram, information of connected parts, connection status and the like on the circuit diagram were visually confirmed. Specifically, there was no final judgment other than a method of directly confirming to a designer himself/herself.

It is to be noted that there is a method of applying attribute into the bypass capacitors in designing a circuit, but load in designing becomes heavier and such method was difficult to be realized.

Specifically, design instruction for bypass capacitors is necessary in designing printed circuit board and checking printed circuit board, and there was the fifth problem that enormous time was required in extracting bypass capacitors.

In addition, extracting items (circuit parts, wirings, etc.) on a circuit diagram as one group by their types and functions and dividing them into groups in order to reflect them on a design instruction in basic designing or creating a check list of a circuit diagram were necessary on making instruction and checking.

Conventionally, search processing has been done for each item (parts, wiring information, etc.) in extracting the groups, enormous time was required in extracting work in proportion to the article quantity of items and parts quantity, and further, extracted data are inherent to the circuit diagram, so that there was the sixth problem that workload and much time in proportion to items were required such that the same extracting work was necessary in another circuit diagram.

Furthermore, in confirming a printed circuit board, which was designed by a printed circuit board design system, for the instruction of a design instruction in high-density and high-speed circuit design of a printed circuit board, associated instruction items were confirmed and inspected and were done manually for corresponding portions, by using search functions of a circuit design system and a printed circuit board design system.

Specifically, because of reasons such as sudden increase of the difficulty level of design caused by digitalization and the difficulty of maintaining the integrity of an entire system by the shortened competitiveness of products or multi-function, the reasons such as the design quality dependent on designers, labor spent in drawing check and corrected instruction is enormous, and shortening the labor has been the key to shorten the lead time of design.

For this reason, there was the seventh problem that the work efficiency deteriorated and enormous labor and cost were required in inspection, confirmation, and drawing check regarding a designed printed circuit board or creating a correction instruction.

Meanwhile, electronic equipment manufacturers have a large number of design conditions and instructions of noise measures, heat measures and the like, which they have been cultivated by conventional product development, in the developing process of new products, such design conditions were instructed to printed circuit board designers before designing a printed circuit board, and the printed circuit board designers designed the printed circuit board according to the instructions.

Then, a prototype of the printed circuit board is formed after the design of the printed circuit board is completed, but before that, verification work whether the design instructions were properly followed were done.

Herein, since some design instructions have rules that cannot be expressed in numerical values, there were cases where automatic check using a CAD system could not be performed, and check for such portions had to be done visually.

Such visual check starts by searching areas in the circuit diagram and the printed circuit board, which correspond to the design instruction, and a search function or the like of the CAD system is used in searching the corresponding areas. To use the function, it is necessary to operate both the circuit diagram and the printed circuit board, and furthermore, since there are cases where articles that must be checked are several hundred or more depending on a product, there was the eighth problem that enormous labor and time were required in check.

Further, conventionally, when visually checking items on a printed circuit board of high-density multiple layer, in order to clearly display contents to be checked, setting for displaying the check contents by taking the interrelation of associated items in consideration has been done manually while the check contents were accurately grasped.

Specifically, if the contents to be checked are not clearly displayed, there is a possibility that the check contents are misrecognized and accurate check cannot be performed.

There was the ninth problem that the work of performing display control every time to prevent misrecognition depended on the skill of operators and it caused significant loss of time.

Furthermore, even if an instruction is given in designing printed circuit board, such instruction contains contents whose quality cannot be maintained unless the circuit board is designed accompanied by knowledge such as experience and logic.

Conventionally, the designer of printed circuit board has needed to search and read books and materials of corresponding technical information in order to understand the instruction, and there was the tenth problem that the designer of printed circuit board needed to spend enormous time in searching and reading the technical information.

It is to be noted that prior art that the applicant of the present invention knows when filing an application for patent is an art described above but not an invention disclosed in documents publicly known, so that there is no prior art information to be described.

DISCLOSURE OF THE INVENTION

Problems to be Solved by the Invention

The present invention has been created in view of the above-described first and second problems that the prior art has, and it is the first and second objects of the invention to provide a printed circuit board design instruction support method between a circuit design and a printed circuit board design, a printed circuit board instruction support device between a circuit design and a printed circuit board design, a Web system, a program, and a computer-readable recording medium, which are capable of displaying a design instruction to be referred to when correctly designing a circuit board based on a design rule in designing a printed circuit board of electronic equipment.

Further, the present invention has been created in view of the above-described third problem that the prior art has, and it is the third object of the invention to provide a printed circuit board design instruction support method between a circuit design and a printed circuit board design, a printed circuit board instruction support device between a circuit design and a printed circuit board design, a Web system, a program, and a computer-readable recording medium, in which damping resistances are correctly arranged based on a design rule in arranging them, in designing a printed circuit board of electronic equipment.

The present invention has been created in view of the above-described fourth and fifth problems that the prior art has, and it is the fourth and fifth objects of the invention to provide a printed circuit board design instruction support method between a circuit design and a printed circuit board design, a printed circuit board instruction support device between a circuit design and a printed circuit board design, a Web system, a program, and a computer-readable recording medium, which are capable of detecting bypass capacitors including a circuit pattern as EMC measure of a printed circuit board.

The present invention has been created in view of the above-described sixth problem that the prior art has, and it is the sixth object of the invention to provide a printed circuit board design instruction support method between a circuit design and a printed circuit board design, a printed circuit board instruction support device between a circuit design and a printed circuit board design, a Web system, a program, and a computer-readable recording medium, which can be used when displaying information of parts and wirings, which is referred to in correctly designing a circuit board by each circuit board, with a design instruction and can be used when displaying a check list for checking whether or not a design is properly designed as instructed for a completed printed circuit board, in designing a printed circuit board of electronic equipment.

Further, the present invention has been created in view of the above-described seventh problem that the prior art has, and it is the seventh object of the invention to provide a printed circuit board design instruction support method between a circuit design and a printed circuit board design, a printed circuit board instruction support device between a circuit design and a printed circuit board design, a Web system, a program, and a computer-readable recording medium, which are capable of improving the work efficiency of printed circuit board design such that the check of drawing is executed efficiently and improving the quality of the printed circuit board design by equalizing design quality to shorten a design period and reduce the manufacturing cost of circuit board such as reducing the number of making prototypes.

The present invention has been created in view of the above-described eighth problem that the prior art has, and it is the eighth object of the invention to provide a printed circuit board design instruction support method between a circuit design and a printed circuit board design, a printed circuit board instruction support device between a circuit design and a printed circuit board design, a Web system, a program, and a computer-readable recording medium, which can be used in verifying whether or not the design of printed circuit board of electronic equipment is correctly performed based on a design instruction, and which are capable of displaying areas to be checked on both of a circuit diagram and a printed circuit board layout diagram for each circuit part to which a design rule is applied by cooperation between a circuit design system and a printed circuit board design system in the design verification of printed circuit board to shorten check time and lighten labor.

The present invention has been created in view of the above-described eighth and ninth problems that the prior art has, and it is the eighth and ninth objects of the invention to provide a printed circuit board design instruction support method between a circuit design and a printed circuit board design, a printed circuit board instruction support device between a circuit design and a printed circuit board design, a Web system, a program, and a computer-readable recording medium, in which, when visually checking items on a high-density and multiple layer printed circuit board, the interrelation between the items are automatically displayed to eliminate the occurrence of misrecognition of contents to be checked by an operator and to lighten the variation and time loss caused by the skill of operators.

The present invention has been created in view of the above-described tenth problem that the prior art has, and it is the tenth object of the invention to provide a printed circuit board design instruction support method between a circuit design and a printed circuit board design, a printed circuit board instruction support device between a circuit design and a printed circuit board design, a Web system, a program, and a computer-readable recording medium, in which appropriate technical information is quickly referred to and considered in designing a printed circuit board by electronically associating the contents of instruction with technical information, by which design based on theory can be done even without experience, and which are capable of shortening a design and improving and unifying design quality.

Means for Solving the Problems

To achieve the above-described first object, the present invention is used in the design work of a printed circuit board, and it can contribute to the improvement of the work efficiency of printed circuit board design and the improvement of the quality of printed circuit board design.

Further, to achieve the above-described second object, the present invention is that only by the action of selecting from a list in which design instruction contents that a circuit designer gave while designing a circuit diagram are divided into "instruction contents" and "keywords of target circuit parts or wirings", for example, target objects are automatically listed from the circuit diagram by using the "keywords of target circuit parts or wirings", and labor and time which were spent in creating the design instruction manually are significantly reduced.

Further, to achieve the above-described third object, the present invention is that damping resistances are automatically extracted from the circuit diagram to realize the significant shortening of extraction time.

Further, to achieve the above-described fourth and fifth objects, the present invention is that bypass capacitors clearly having no problem, which the circuit designer does not need to determine their adequacy, are automatically omitted from capacitors to be determined to achieve the shortening of time for checking drawings itself, and furthermore, the shortening of the design period.

Further, to achieve the above-described sixth object, the present invention is that keywords are set to articles having the same type and function, for example, extraction conditions for extracting an item and another program activation instructions are held as a common master in a predetermined storage region for the keywords, data in which only keywords are allocated for each article is formed when displaying a design instruction or a check list on the circuit diagram, and an extraction condition that falls under a keyword is acquired from the common master to search an item from the circuit diagram when searching an individual item, items are updated into the latest status when search is performed again with this, the design instruction and the check list are updated into the latest items in the circuit and can be diverted when the data is copied to another circuit diagram and search is performed again and time spend in creating the design instruction is significantly reduced, and the instruction and the check list can be formed only by an update processing because articles of ones diverted in the circuit diagram are virtually not changed.

Further, to achieve the above-described seventh object, the present invention is that areas to which a qualitative instruction that cannot be automatically checked by using the printed circuit board design system, that is, an instruction such as "as close as possible" and "as short as possible" is applied can be automatically detected to request a designer to make a judgment for the instruction, and the equalization of variation of design quality caused by the difference of experience of designers is achieved by storing logical information in the background of the rules severally to cooperatively display it on the instruction.

Further, to achieve the above-described eighth and ninth objects, the present invention is that, when visually checking items on a high-density multiple layer printed circuit board, contents to be checked are clearly displayed automatically in performing cross-probe from a check sheet to drastically lower the possibility of misrecognizing the check contents to make it possible to produce a result not depending on the skill of an operator who performs check or to form the same display condition in the check using the same check sheet, and furthermore, time loss is lightened. In other words, when items are selected, the areas to be checked on both of a circuit diagram and a printed circuit board are displayed by cooperation a circuit design system and a printed circuit board design system to shorten check time and lighten labor.

Further, to achieve the above-described tenth object, the present invention is that appropriate technical information can be quickly referred to and considered in designing a printed circuit board and design based on theory can be done even without experience by electronically associating the contents of design instruction with technical information, and the shortening of design and the improvement and unification of design quality are realized.

Specifically, the present invention is a printed circuit board design instruction support device that supports printed circuit board design between a circuit design and a printed circuit board design, in which the device has means for displaying design instruction information regarding previously fixed printed circuit board design based on a circuit diagram designed by a circuit design.

Further, the present invention displays keywords, which are associated with the design instruction information and set based on the type of items regarding a circuit design by the display means, together with the design instruction information.

Further, the present invention has means for extracting items included in the circuit diagram based on the keywords.

Further, the present invention extracts damping resistances being items included in the circuit diagram and target ICs of the resistances based on the part attribute of the damping resistances and the wiring connection information of the damping resistances by the extraction means.

Further, the present invention extracts bypass capacitors being items included in the circuit diagram and target ICs of the capacitors based on the wiring connection information of the bypass capacitors by the extraction means.

Further, the present invention extracts bypass capacitors being items included in the circuit diagram and target ICs of the capacitors based on the arrangement positional information of the bypass capacitors and the wiring connection information of the bypass capacitors by the extraction means.

Further, the present invention is extracts bypass capacitors being items included in the circuit diagram, target ICs of the capacitors, and the information of wiring connecting the both parts by the extraction means.

Furthermore, the present invention has means for associating items that were extracted based on the extraction means with the design instruction information via the keywords, wherein the display means displays the items associated by the association means.

Further, the present invention has means for selecting items or keywords displayed by the display means and means for highlighting items on a printed circuit board diagram designed by a printed circuit board design, which correspond to items selected by the selection means, when items are selected by the selection means, and highlighting items associated with keywords on the printed circuit board diagram, which correspond to keywords selected by the selection means, when keywords are selected by the selection means.

Further, the present invention has means for selecting items or keywords displayed by the display means and means for highlighting items on the circuit diagram, which correspond to items selected by the selection means, when items are selected by the selection means, and highlighting items associated with keywords on the circuit diagram, which correspond to keywords selected by the selection means, when keywords are selected by the selection means.

Furthermore, the present invention has means for executing macro that supports check in printed circuit board design before items are highlighted, after items are highlighted, or before and after items are highlighted by the highlight means.

Further, the present invention has means for managing whether or not a printed circuit board design was performed according to the design instruction information.

Further, in the present invention has means for managing authorization to a printed circuit board design that was performed based on the design instruction information.

Further, the present invention has means for performing history management of pass-fail judgment and the like by separately adding an empty article for inputting in the management means when a correction of printed circuit board design is necessary.

Furthermore, the present invention has means for providing information, which is accumulated in a Web server, in response to a request from the printed circuit board design instruction support device according to the present invention.

Further, the present invention has means for means for performing calculation in a Web server and providing the result of the calculation in response to a request from the printed circuit board design instruction support device according to the present invention.

Further, the present invention has means for accumulating information in a Web server in response to a request from the printed circuit board design instruction support device according to the present invention.

Further, the present invention is a program for allowing a computer to function as the printed circuit board design instruction support device according to the present invention.

Furthermore, the present invention is a program for allowing a computer to function as the printed circuit board design instruction support device according to the present invention.

Further, the present invention has a step of displaying design instruction information regarding previously fixed printed circuit board design based on a circuit diagram designed by a circuit design.

Further, the present invention is a program for allowing a computer to execute the printed circuit board design instruction support method according to the invention.

Still further, the present invention is a computer-readable recording medium recording the program according to the present invention.

EFFECTS OF THE INVENTION

Since the present invention is constituted as described above, an excellent effect is exerted that the present invention is capable of automatically displaying a design instruction to be referred to in order to correctly perform circuit board design based on a design rule in designing the printed circuit board of electronic equipment.

Further, since the present invention is constituted as described above, an excellent effect is exerted that the present invention is capable of correctly arranging damping resistances based on a design rule in designing printed circuit board of electronic equipment.

Further, since the present invention is constituted as described above, an excellent effect is exerted that the present invention is provided with an automatic check function of bypass capacitors including a circuit pattern as EMC measure of a printed circuit board.

Further, since the present invention is constituted as described above, an excellent effect is exerted that the present invention can be used when displaying the information of parts and wirings, which are referred to in correctly performing circuit board design based on a design rule for each circuit board, as a design instruction, and can be used when displaying a check list for checking whether or not a design is designed as instructed for a printed circuit board.

Further, since the present invention is constituted as described above, an excellent effect is exerted that the present invention, where the check of drawing can be efficiently executed to improve the work efficiency of printed circuit board design and design quality can be equalized to improve the design quality of printed circuit board, and which are capable of reducing the manufacturing cost of circuit board such as the shortening of a design period and the reduction of the number of making prototypes, becomes possible.

Further, since the present invention is constituted as described above, an excellent effect is exerted that the present invention, which can be used in verifying whether or not a printed circuit board design of electronic equipment is correctly designed based on a design rule, and in the design verification of a printed circuit board, can simultaneously display areas to be checked both on a circuit diagram and a printed circuit board layout diagram for each circuit part to which the design rule is applied by cooperation between a circuit design system and a printed circuit board design system to shorten check time and lighten labor, becomes possible.

Furthermore, since the present invention is constituted as described above, an excellent effect is exerted that the present invention, in which when items on a high-density multiple layer printed circuit board are visually checked, the interrelation or the like between the items are automatically displayed, and which are capable of avoiding misrecognition of the contents to be checked by an operator and lightening the variation by the skill of operator and time loss, becomes possible.

Still further, since the present invention is constituted as described above, an excellent effect is exerted that a printed circuit board design instruction support method between a circuit design and a printed circuit board design, a printed circuit board instruction support device between a circuit design and a printed circuit board design, a Web system, a program, and a computer-readable recording medium, in which appropriate technical information can be quickly referred to and considered in designing a printed circuit board by electronically associating the contents of design instruction with technical information, design based on theory can be done even without experience, and the shortening of a design and the improving and unifying of design quality are possible, can be provided.

BRIEF DESCRIPTION OF THE DRAWINGS

FIG. 2 is a display screen showing cells for inputting each article of design implementation information (circuit board design side) and printed circuit board design support implementation information, in the printed circuit board design instruction support device.

FIG. 4(a) is a display screen in automatically inputting a date and a person in charge, and FIG. 4(b) is a display screen in inputting a check result.

FIG. 5(a) is a display screen in displaying aggregate information of a check result, and FIG. 5(b) is a display screen in inputting a check result on a keyword row.

FIG. 8 is a display screen showing an example of a design instruction and extraction conditions in processing automatic extraction in the item automatic extraction system.

FIG. 10 is a conceptual explanatory view of an item highlighting system.

EXPLANATION OF REFERENCE CHARACTERS

Figure 1:
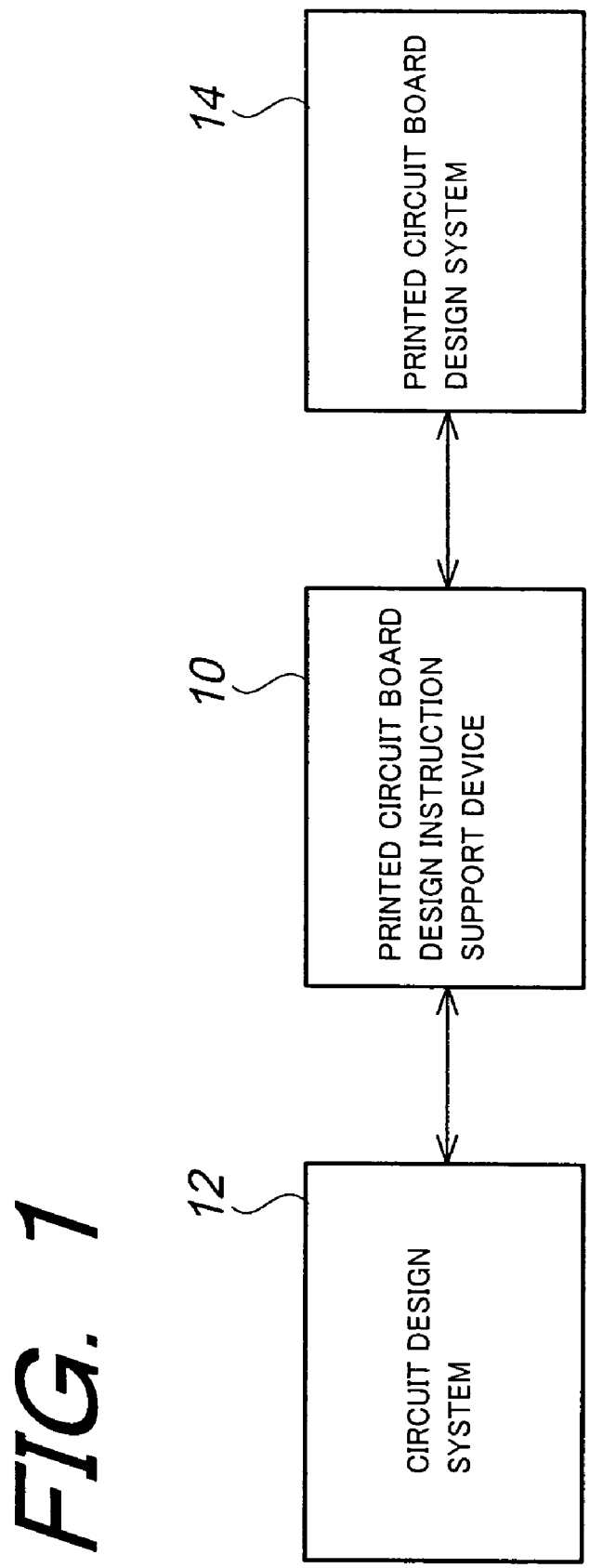
FIG. 1 is explanatory view showing the association between the printed circuit board design instruction support device, the circuit design system, and the printed circuit board design system according to the present invention.

10 Printed circuit board design instruction support device
12 Circuit design system
14 Printed circuit board design system
100 Design instruction common database
101 Design instruction exclusive database
104 Screen of circuit board design instruction support device
106 Screen of circuit design system
108 Screen of printed circuit board design CAD
110 Circuit diagram CAD database

BEST MODE FOR IMPLEMENTING THE INVENTION

In the following, description will be made in detail for an embodiment example of the a printed circuit board design instruction support method between a circuit design and a printed circuit board design, the printed circuit board instruction support device between a circuit design and a printed circuit board design, the Web system, the program, and the computer-readable recording medium according to the present invention with reference to the attached drawings.

1. Overall Constitution

The printed circuit board design instruction support device between a circuit design and a printed circuit board design (hereinafter, simply referred to as "printed circuit board design instruction support device" appropriately) 10 according to the present invention is an integrated system of each system (described later), and the printed circuit board design instruction support device 10 cooperates a circuit design system 12 and a printed circuit board design system 14 as shown in FIG. 1, and rules regarding circuit design are commonly used between the circuit design system 12 and the printed circuit board design system 14.

As a specific system that builds the printed circuit board design instruction support device 10 in the present invention, that is, specific means for cooperating the circuit design system 12 and the printed circuit board design system 14, there exists an electronic design instruction creation support system in circuit design, an item automatic extraction system from a circuit diagram, a design rule check support system in printed circuit board design, an item highlighting system in performing cross-probe, a damping resistance automatic extraction system from a circuit diagram, and a bypass capacitance automatic extraction system from a circuit diagram, for example.

Herein, the printed circuit board design instruction support device 10 is provided with various functions as follows.

(1) Tabular Format Such as Excel (Registered Trademark)

By employing a tabular format such as Excel (registered trademark), design instructions and check conditions can be easily grasped. Further, since design instructions and items are in fixed rows that are not to be scrolled, the design instructions or the like are not hidden when performing check. The cell width of each article can be freely changed.

(2) Inputting Implementation Information

Design implementation information and printed circuit board design instruction support implementation information can be input each time when printed circuit board design instruction support is implemented. An implemented date, a person in charge, a result and the like can be severally input as the implementation information.

(3) Cross-Probe

Since a cross-probe message performing expansion and display of an area to be checked can be sent to the circuit design system, the printed circuit board design system, and a transmission line analysis system, an implementation result can be easily checked. Further, information to be transmitted can be transmitted by items (reference, net, frame) or by keywords. Furthermore, by allocating a Python language-based macro for the keywords and items, macro can be executed for the transmission line analysis system before and after cross-probe.

(4) Search Function

A target article can be quickly found by a search function based on character string.

(5) Associating Documents

Documents can be associated with individual design instruction or by printed circuit board design instruction support implementation information. With this, more detail information can be notified to a designer. Further, associated documents can be archived (copied) into specific directories. In addition, the associated documents can be opened on Windows (registered trademark) if a tool associated with the documents exists.

(6) Inputting/Outputting CSV Files

Since CSV files can be input/output, printed circuit board design instruction information that has been created on Excel (registered trademark) can be migrated.

(7) Encrypting Database

By encrypting database, information accumulated in database can be prevented from being leaked to the outside. Information accumulated in database is displayed only when the device is activated on a manager mode by an option at the time of execution.

Then, in the printed circuit board design instruction support device 10, cells for inputting each article of the design implementation information (circuit board design side) and the printed circuit board design support implementation information (PCB-DR record, that is to say circuit design side) are added as shown in FIG. 2. Note that the design implementation information (circuit design side) and the printed circuit board design support implementation information (circuit design side) are as follows.

a. Design Implementation Information (Circuit Board Design Side)

As the design implementation information, information whether or not a circuit board designed was performed according to a design instruction is input. The information has the four articles that are an implementation date, a person in charge, before printed circuit board design instruction support (implemented result), and comment before printed circuit board design instruction support, and they can be input by items.

b. Printed Circuit Board Design Support Implementation Information (Circuit Design Side)

As the printed circuit board design support implementation information, check result information of printed circuit board design instruction support is input. The information has the five articles that are an implementation date of check, a person in charge, result information, comment, and an associated file, and they can be input by items.

Figure 3A:
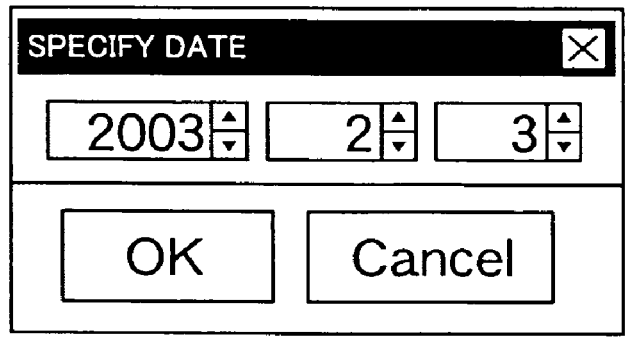
FIG. 3(a) is a display screen in inputting a date.

Next, description will be made for the editing method of each cell. Each article of the implementation information has a different input method depending on types of information to be input. In the following, input methods depending on types of information will be shown.

a. Inputting a Date (Refer to FIG. 3(a))

Figure 3B:
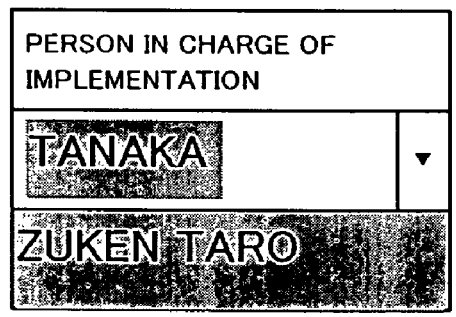
FIG. 3(b) is a display screen in inputting a name.

Inputting of the implementation date and the check date apply to this. Since a " . . . " button is displayed when these cells have focus, it should be clicked. Then, since a date input dialog is displayed, a date is specified on dialog and an "OK" button should be clicked.

b. Inputting a Name (Refer to FIG. 3(B))

Inputting of the person in charge applies to this. When the cell of the person in charge is double-clicked, it becomes a cell-editable condition. A name should be input under this condition.

Further, because names that were input once are displayed in a list when performing input, a name can be also input by selecting from the list (names to be saved are for five persons, and they are common to the design implementation information and the printed circuit board design instruction support implementation information).

c. Selecting a List (Refer to FIG. 3(c) and FIG. 4(a))

Figure 3C:
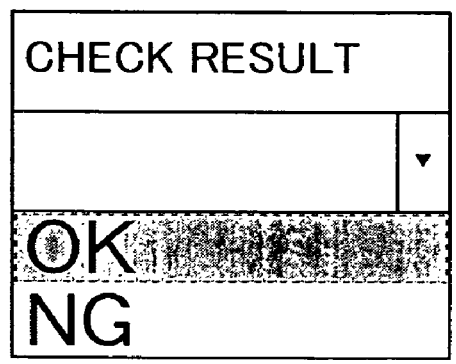
FIG. 3(c) is a display screen in selecting a list.

Before printed circuit board design instruction support of the design implementation information and the check result of printed circuit board design instruction support implementation information apply to this. Since a "▼" button is displayed when these cells have focus, it should be clicked. Then, settable articles are displayed in a list as shown in FIG. 3(c), a proper article should be selected.

Meanwhile, in the case where no input has been made for the date or the person in charge when input was made for before printed circuit board design instruction support or the check result, for the date and the person in charge are automatically input, and a login name is used as the person in charge at this point (refer to FIG. 4(a)).

d. Inputting Text

The comment before printed circuit board design instruction support of design implementation information and the comment of printed circuit board design instruction support implementation information apply to this. Since these cells become a cell-editable condition when they are double-clicked, a proper character string should be input.

e. Inputting a File Name

The associated files apply to this. Since the " . . . " button is displayed when the cells of the associated files have focus, it should be clicked. Then, since a file selection dialog is displayed, a file to be associated should be selected. Although only the file name of the file selected here is displayed, the storage directory of associated files is internally held in a full path.

It is to be noted that the input start action of articles can be also activated by "change" for all articles in an assist menu other than by double-clicking. Additionally, input by copy & paste by selecting a plurality of cells is also possible. Herein, pasting a character string in a cell where a date should be input or pasting a character string other than OK/NG in a cell where only OK/NG is filled causes an error, and input is not accepted.

To clear cell contents, a cursor should be moved to a cell that needs to be cleared and a "DEL" key should be pressed. If a plurality of cell is selected, only a selective cell of a column having a cell cursor is cleared.

Next, description will be made for the input of a check result. The check result can be also set to a value other than OK/NG, and the definition of the check result is performed by a resource.

For example, when

CheckStatus{"OK" "Check again" "Reconsideration required"} is defined in the resource, the input of the check result becomes as shown in FIG. 4(b).

In FIG. 4(b), the first blank is an article for clearing the cell contents, and it is automatically added regardless of a resource definition.

Figures 5A, 5B:
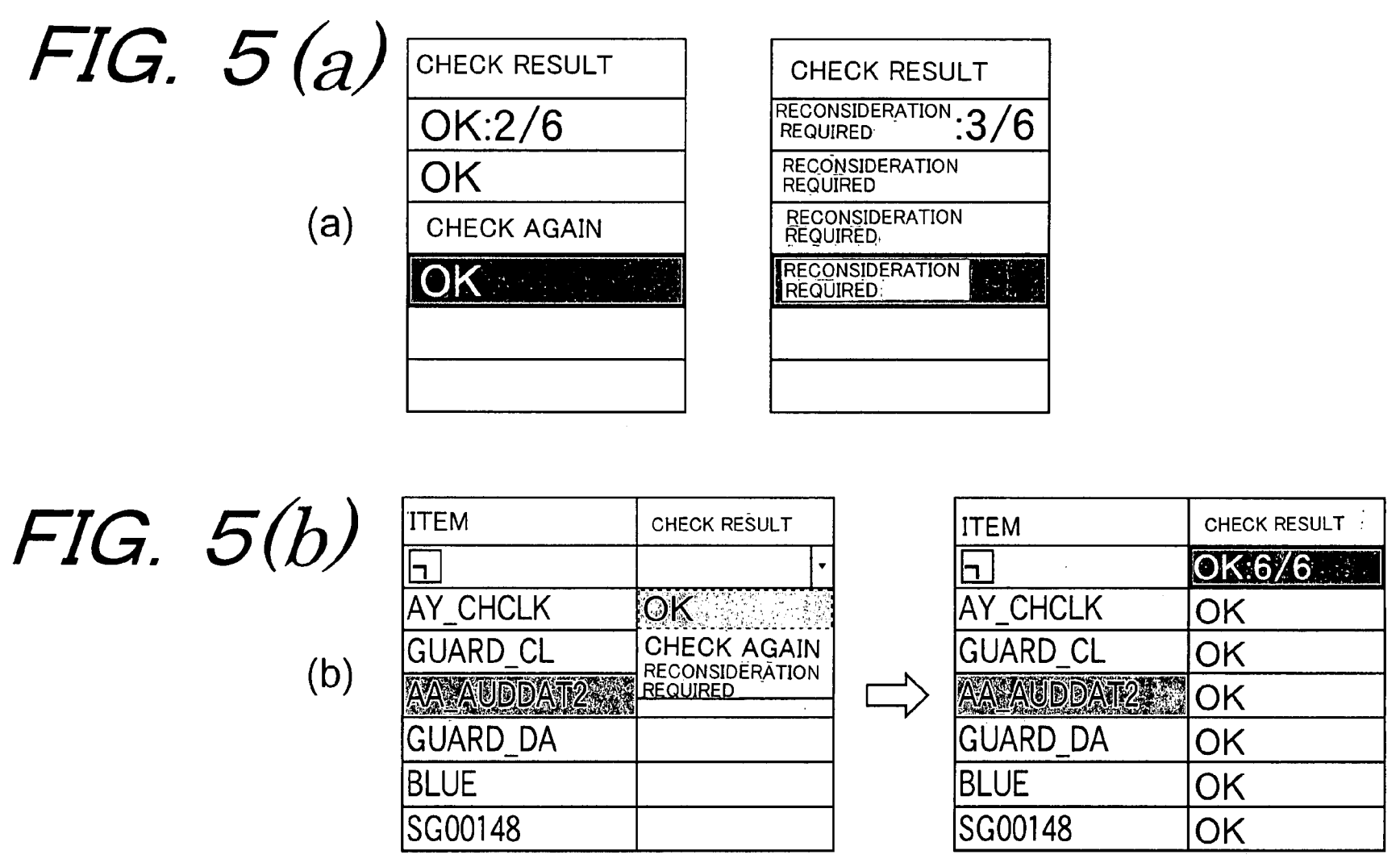

Meanwhile, since it is hard to grasp a check status when items are folded, the cell of check result in a keyword row displays aggregate information in order to grasp the check status of items that belong to the keyword (refer to FIG. 5(a)).

The aggregate information displays the number of OKs (first article defined in resource) and the total number of items. Further, when all check results of the keyword are the same value, their names and quantity/total number of items are displayed.

Furthermore, when input is performed to the cell of check result in the keyword row, the same value can be set to each item of the keyword (refer to FIG. 5(b)).

Since this makes it possible to input results at once by keywords, work efficiency can be improved. However, input can be done only into a blank cell, and input cannot be done into a cell where a result is already input.

In the following, description will be made severally for each of specific means that build the above-described printed circuit board design instruction support device 10.

2. Electronic Design Instruction Creation Support System on Circuit Design

Figure 6:
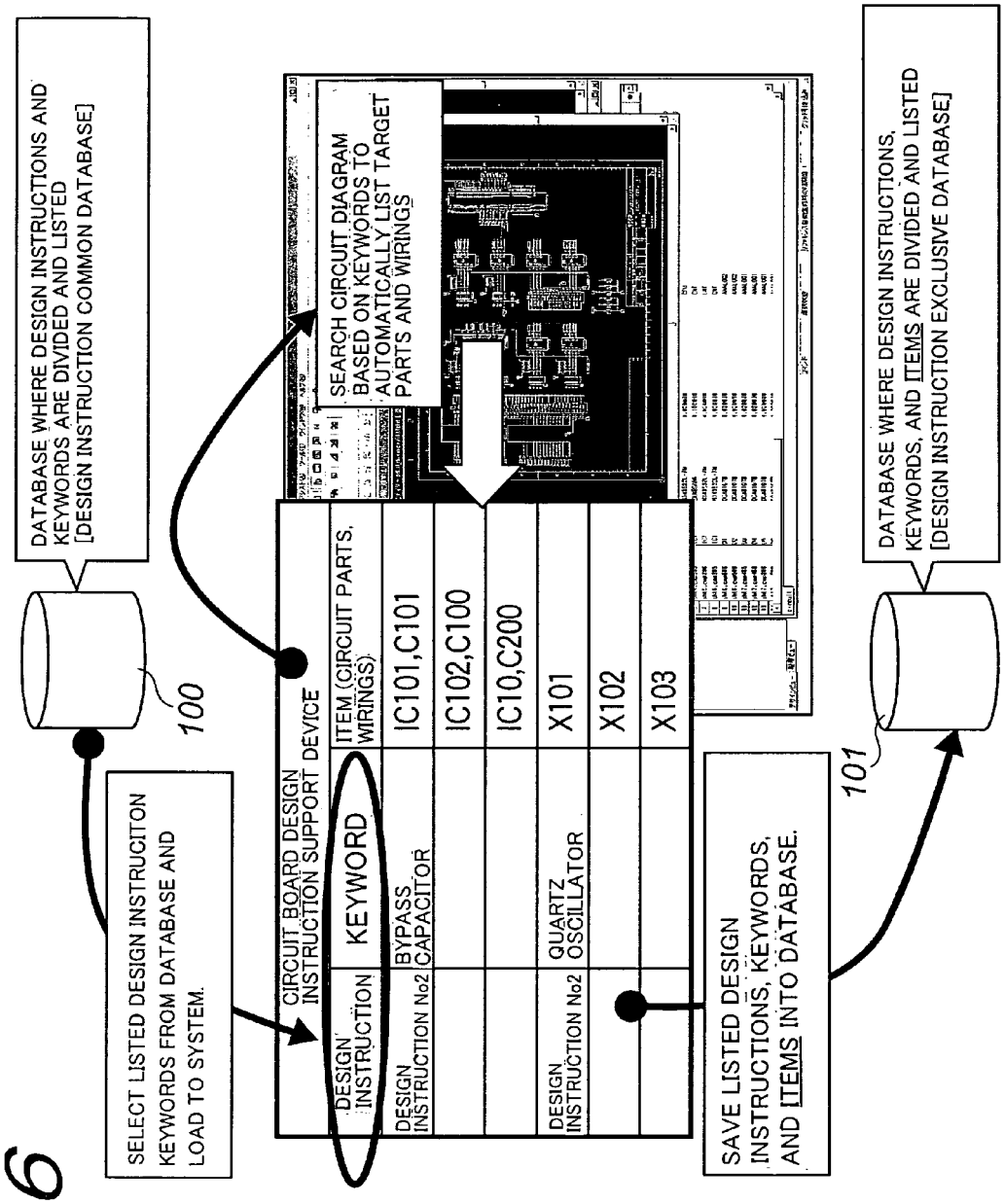
FIG. 6 is a conceptual explanatory view of an electronic design instruction formation support system.

FIG. 6 shows the conceptual explanatory view of an electronic design instruction creation support system on circuit design (hereinafter, simply referred to as "electronic design instruction creation support system" appropriately), and the electronic design instruction creation support system is provided with a design instruction common database 100 that is a database where design instructions and keywords are divided and listed.

In this electronic design instruction creation support system, design instructions and keywords necessary in current design are selected from the design instruction common database 100 where design instructions and keywords are divided and listed, and they are loaded to this system.

Next, circuit diagram search is executed based on the loaded keywords, target items (circuit parts, wirings) are automatically extracted to this system and listed.

Next, design instructions, keywords, and items listed are saved into a design instruction exclusive database 101 that is a database where design instructions, keywords, and items (circuit parts, wirings) are divided and listed.

It is to be noted that the details of an automatic extraction method will be described in detail in the next "3. Item automatic extraction system from circuit diagram".

3. Item Automatic Extraction System from Circuit Diagram

Figure 7:
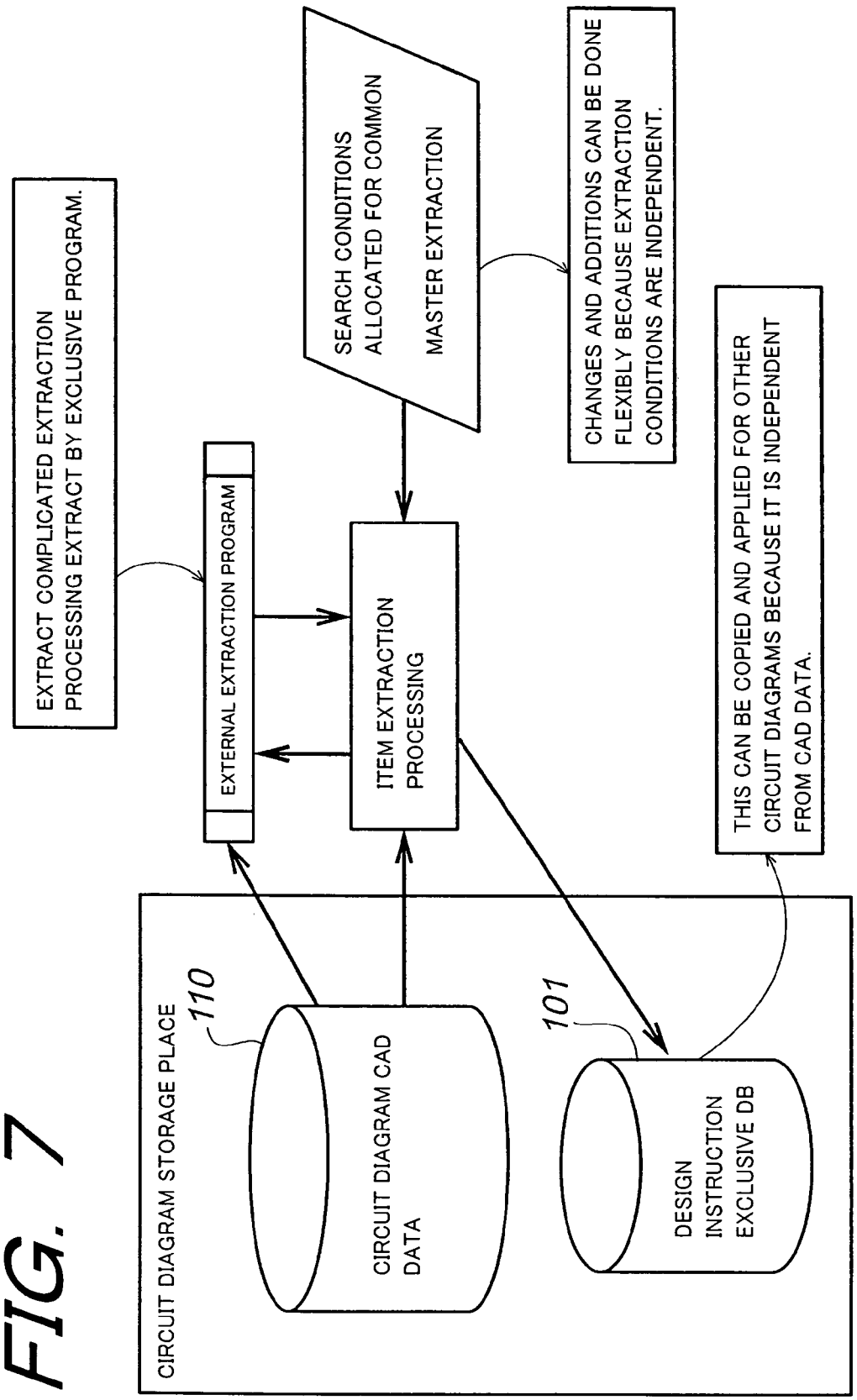
FIG. 7 is a conceptual explanatory view of an item automatic extraction system.

FIG. 7 shows the conceptual explanatory view of an item automatic extraction system from circuit diagram (hereinafter, simply referred to as "item automatic extraction system" appropriately), and it is provided with the design instruction exclusive database 101 that is a database where design instructions, keywords, and items (circuit parts, wirings) are divided and listed, independently of a circuit diagram CAD database 110 being the database of circuit diagram CAD data.

This item automatic extraction system is provided with an external extraction program, and item extraction processing is performed according to the external extraction program if a complicated extraction processing is necessary.

Further, FIG. 8 shows an example of a design instruction and extraction conditions when processing automatic extraction in the item automatic extraction system.

4. Design Rule Check Support System in Printed Circuit Board Design

Figure 9:
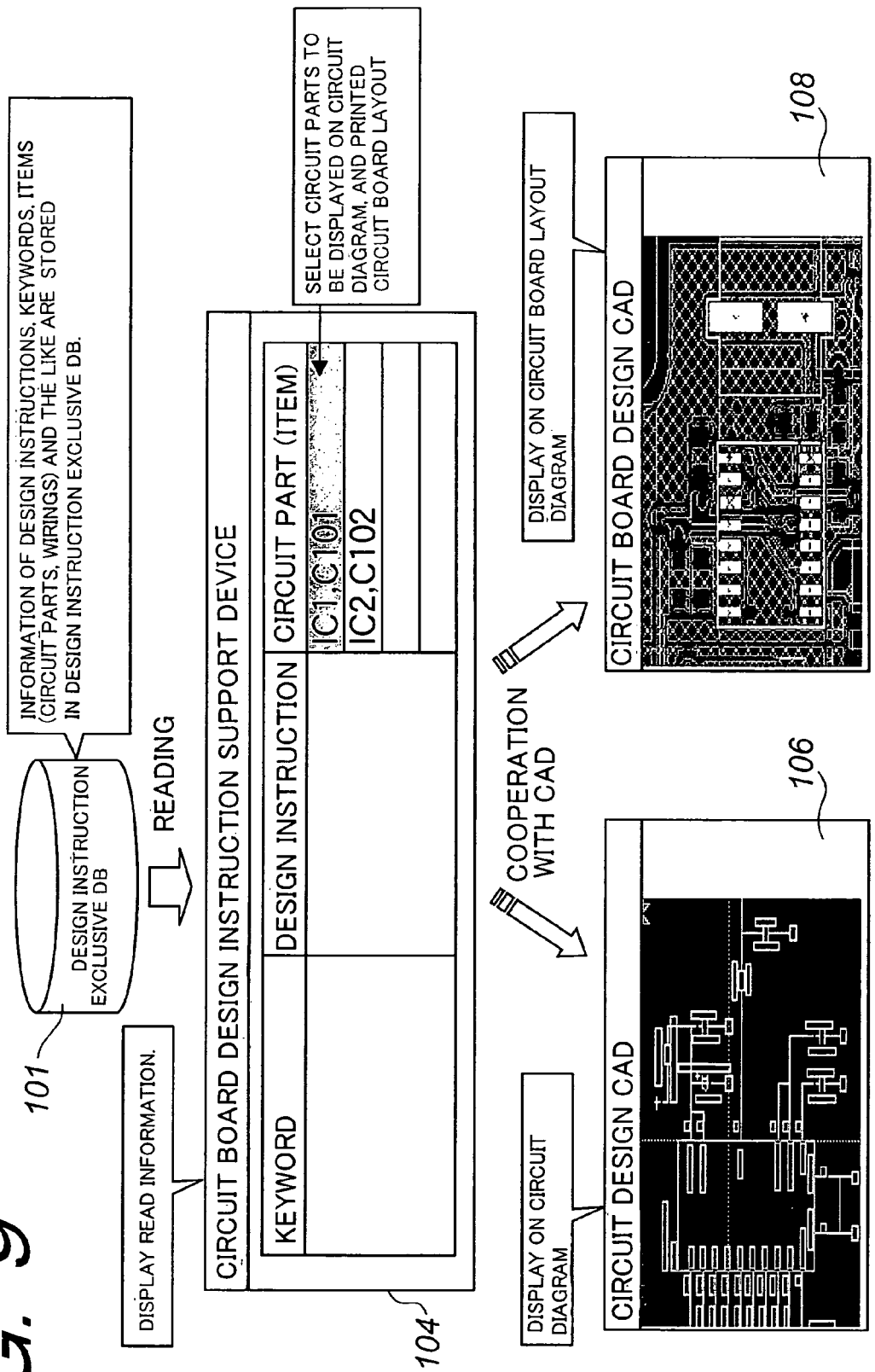
FIG. 9 is a conceptual explanatory view of a design rule check support system.

FIG. 9 shows the conceptual explanatory view of a design rule check support system in printed circuit board design (hereinafter, simply referred to as "design rule check support system" appropriately), and the design rule support system is provided with the design instruction exclusive database 101 that is a database where design instructions, keywords, and items (circuit parts, wirings) are divided and listed.

When a keyword or an item displayed on the screen 104 of the circuit board design instruction support device is selected, items (circuit parts, wirings) corresponding to the selected information are identifiably displayed on a circuit diagram, which is displayed on the screen 106 of the circuit design system, while their color and brightness are changed, and are identifiably displayed on a circuit board layout diagram, which is displayed on the screen 108 of the printed circuit board design CAD, while their color and brightness are changed.

5. Item Highlighting System in Performing Cross-Probe

FIG. 10 shows the conceptual explanatory view of an item highlighting system in performing cross-probe (hereinafter, simply referred to as "item highlighting system" appropriately.

Specifically, to efficiently execute the printed circuit board design instruction support, cross-probe can be performed by cooperation between a circuit design system, a transmission line analysis system or the like. This function can be executed by setting the circuit design system and the transmission line analysis system to a communicable condition, and by "See (circuit diagram & circuit board)" of an assist menu after selecting an item, a keyword or a cell in implementation information to which cross-probe needs to be performed (refer to FIG. 11(a)).

Alternatively, in the case where the cell cursor is on a cell to which cross-probe can be performed, cross-probe can be also executed by a shortcut key. At this point, the shortcut key is defined in the resource. For example, when XprovKey: "Ctrl+S"

is defined, cross-probe is executed when a control key and an "s" key are simultaneously pressed. If it is not defined in the resource, of cross-probe by the shortcut key cannot be executed.

Execution of cross-probe can be also performed by specifying a plurality of keywords or items. However, in the case where a plurality of cells in the implementation information is selected across rows, cross-probe is performed only to a selected item of a row having the cell cursor.

Further, it is also possible to execute Python language-based macro to the transmission line analysis system before and after cross-probe. However, regarding the Python language-based macro to be executed, a macro file needs to be allocated for items and keywords in advance by the printed circuit board design instruction support device 10.

The rule of macro execution is as follows.

In macro, pre-macro that is executed before cross-probe and post-macro to be executed after cross-probe can be allocated severally for keywords and items.

Macro of keyword is executed when selecting a keyword.

Macro of item is executed when selecting an item. In the case where macro is not allocated for an item when macro is allocated for a keyword to which the item belongs, and the macro of keyword is executed.

In the case where a plurality of items are selected, macro to be executed is determined by using the position of the cell cursor as a standard.

In the case where macro is not allocated, only cross-probe is performed.

Further, in the case where the allocated macro file is only a file name, search is performed in the following order and a file that is found first is executed.

1. [% HOME %¥]% red_macros_local %

2. [% HOME %¥]% red_data_local %¥macros

3. % HOME %¥red¥_data¥macros

4. [% HOME %¥]%red_data %¥macros

Herein, portions bracketed by [ ] are used when other portions are not absolute paths. For example, in the case where "my_data_dir¥macros" is set to an environment variable % red_macros_local %, % HOME % is added. On the other hand, in the case where "d:¥users¥zuken¥my_data_dir¥macros" is set to % red_macros_local %, % HOME % is not added.

Herein, when aaa.py under % HOME %¥red_date¥macros needs to be executed, aaa.py must not exist in other directories to be searched.

In addition, to execute macros in directories other than the above-described ones to be searched, it is necessary to allocate macro files while specifying them in full path.

Figure 11:
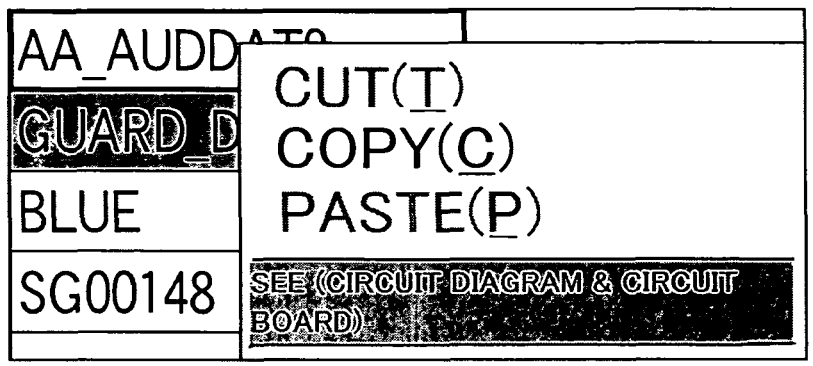
FIG. 11(a) is a display screen in executing a cross-probe.
FIG. 11(b) is a display screen showing a mode of cross-probe.
FIG. 11(c) is a display screen showing macro-execution authorization.
Figure 11:
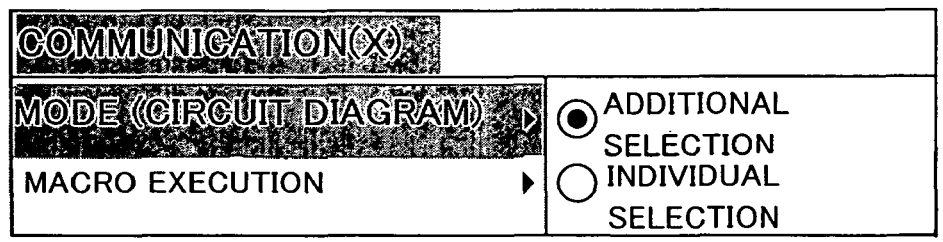
Figure 11:
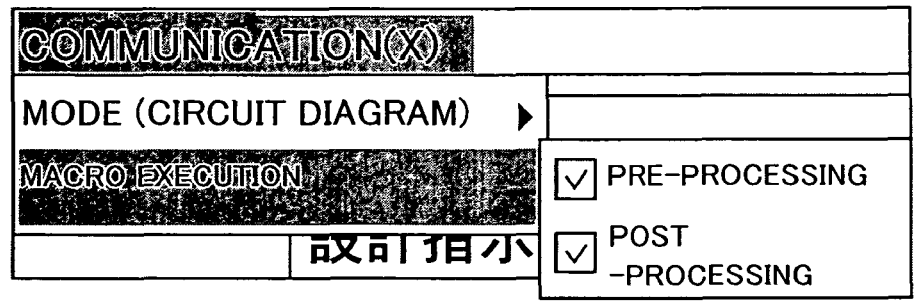

Incidentally, cross-probe for the circuit design system has modes (additional selection/individual selection) (refer to FIG. 11(*b*)). They are switched by "Communication"→"Mode (circuit diagram)".

In the additional selection mode, selection items are added one after another by cross-probe. In the individual selection mode, the previously selected condition is cleared by cross-probe and only a cross-probed item becomes a selected condition. It is to be noted that this mode selection is invalid to the transmission line analysis system and only the additional selection works.

Further, in communication with the transmission line analysis system, setting that an allocated macro is not executed can be also done. This is done such that ON/OFF is each separately switched for pre-processing/post-processing from "Communication"→"Macro execution authorization" in menu (refer to FIG. 11(*c*)).

6. Damping Resistance Automatic Extraction System from Circuit Diagram

Figure 12:
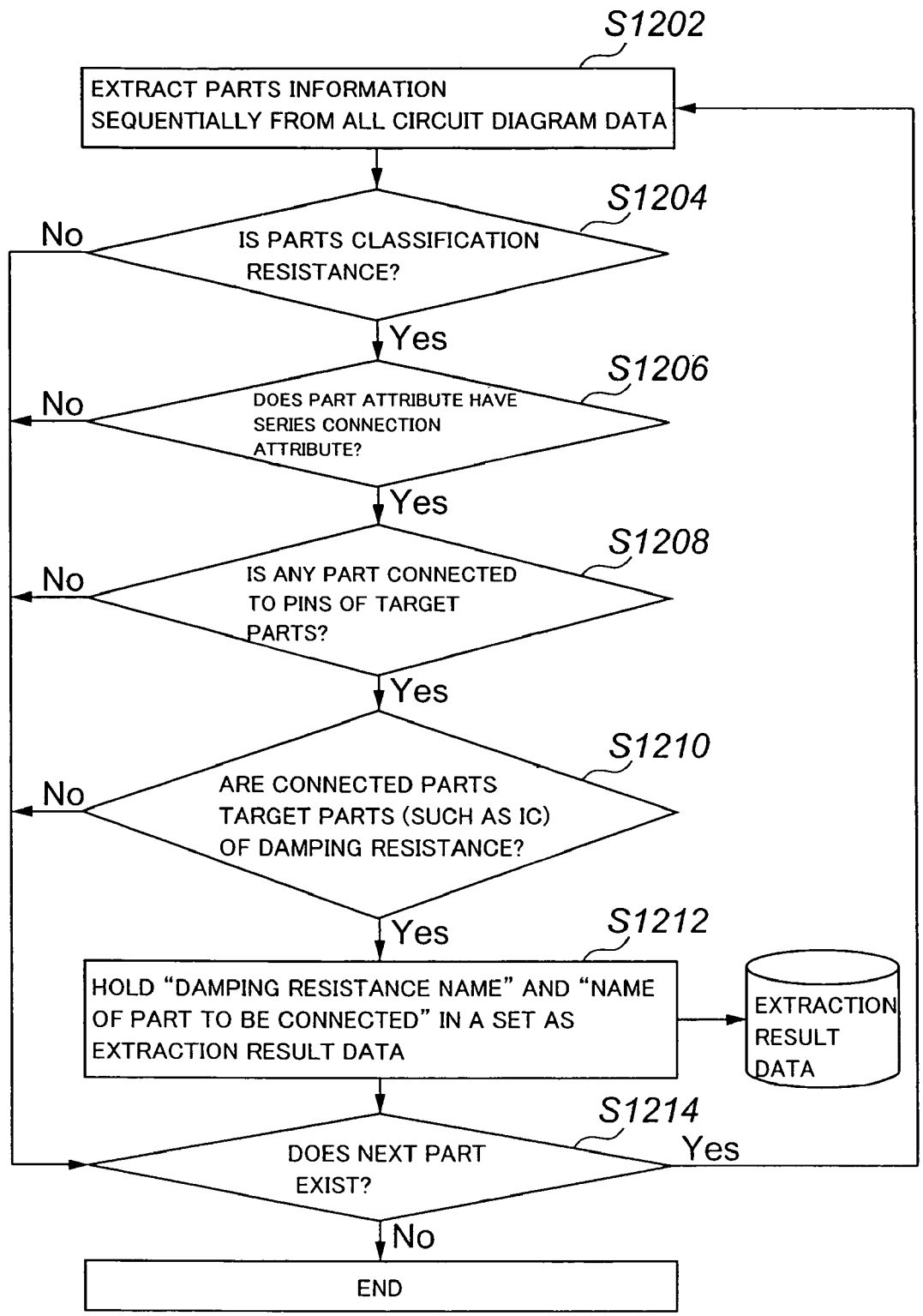
FIG. 12 is a flowchart showing the processing of a damping resistance automatic extraction system.

FIG. 12 shows the flowchart showing the processing of a damping resistance automatic extraction system from a circuit diagram (hereinafter, simply referred to as "damping resistance automatic extraction system" appropriately).

In the damping resistance automatic extraction system, parts information is sequentially extracted from all circuit diagram data first (step S1202, step S1214), and then, all parts falling under resistance parts on the circuit diagram are extracted (step S1204).

Next, parts where the attribute of series connection is in the attribute of IBIS model are extracted from extracted resistance parts (step S1206).

Further, when all pins of the extracted resistance parts are searched and there are wirings connected to the pins, parts connected to the wirings are searched (step S1208).

Furthermore, whether or not the parts connected to the wirings are target parts of damping resistance from the classification of parts (such as IC)(step S1210).

Next, "damping resistance name" and "name of part connected to wiring" are returned as a result for each part to be searched (step S1212). Regarding the result, a plurality of (1:n) combinations exist.

7. Bypass Capacitor Automatic Extraction System from Circuit Diagram

Figure 13:
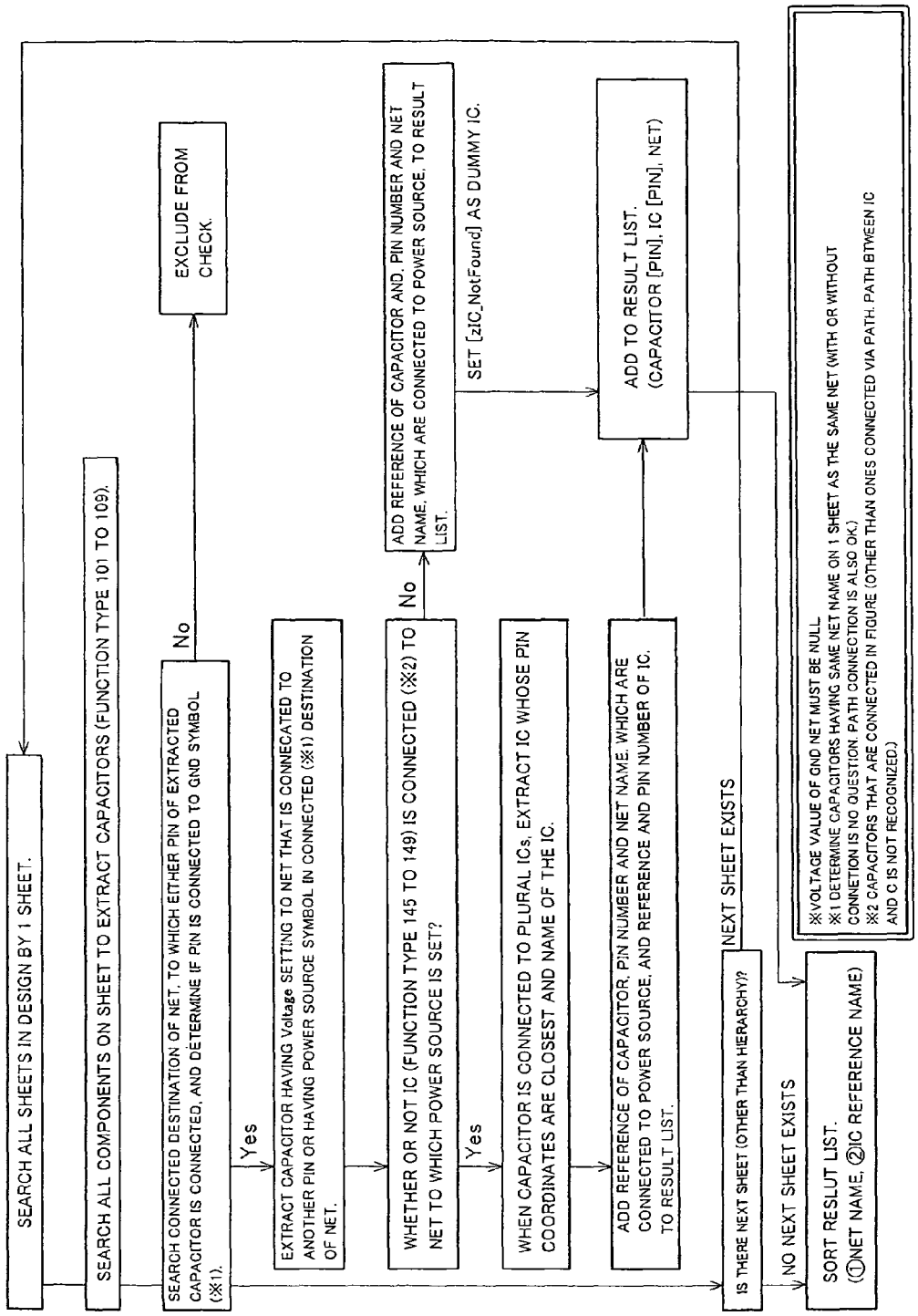
FIG. 13 is a flowchart showing the processing outline of a bypass capacitor automatic extraction system.

FIG. 13 shows the flowchart showing the processing outline of a bypass capacitor automatic extraction system from a circuit diagram (hereinafter, simply referred to as "bypass capacitor automatic extraction system" appropriately).

Description will be made with reference to the flowchart. In the bypass capacitor automatic extraction system, when bypass capacitors are arranged on a circuit diagram, a circuit diagram is formed based on design rule that they are arranged near connection pins of target ICs.

Next, capacitors are extracted from the circuit diagram according to the type of parts, and wirings connected from the extracted capacitors are searched.

Then, capacitors where connection of the both ends of capacitor are connected to a power source and ground are extracted, and capacitors from which wiring is further connected to IC toward the power source side are extracted from the extracted capacitors.

In the case where the capacitors connected to IC, which were extracted in this manner, are connected to a plurality of ICs, an IC whose distance of pin connected by wiring is the closest is extracted.

The capacitors connected to IC, which were extracted above, are output as bypass capacitors on a list together with an IC making a pair and the name of wiring that connects them.

8. Web System of a Printed Circuit Board Design System Cooperation Type

Figure 14:
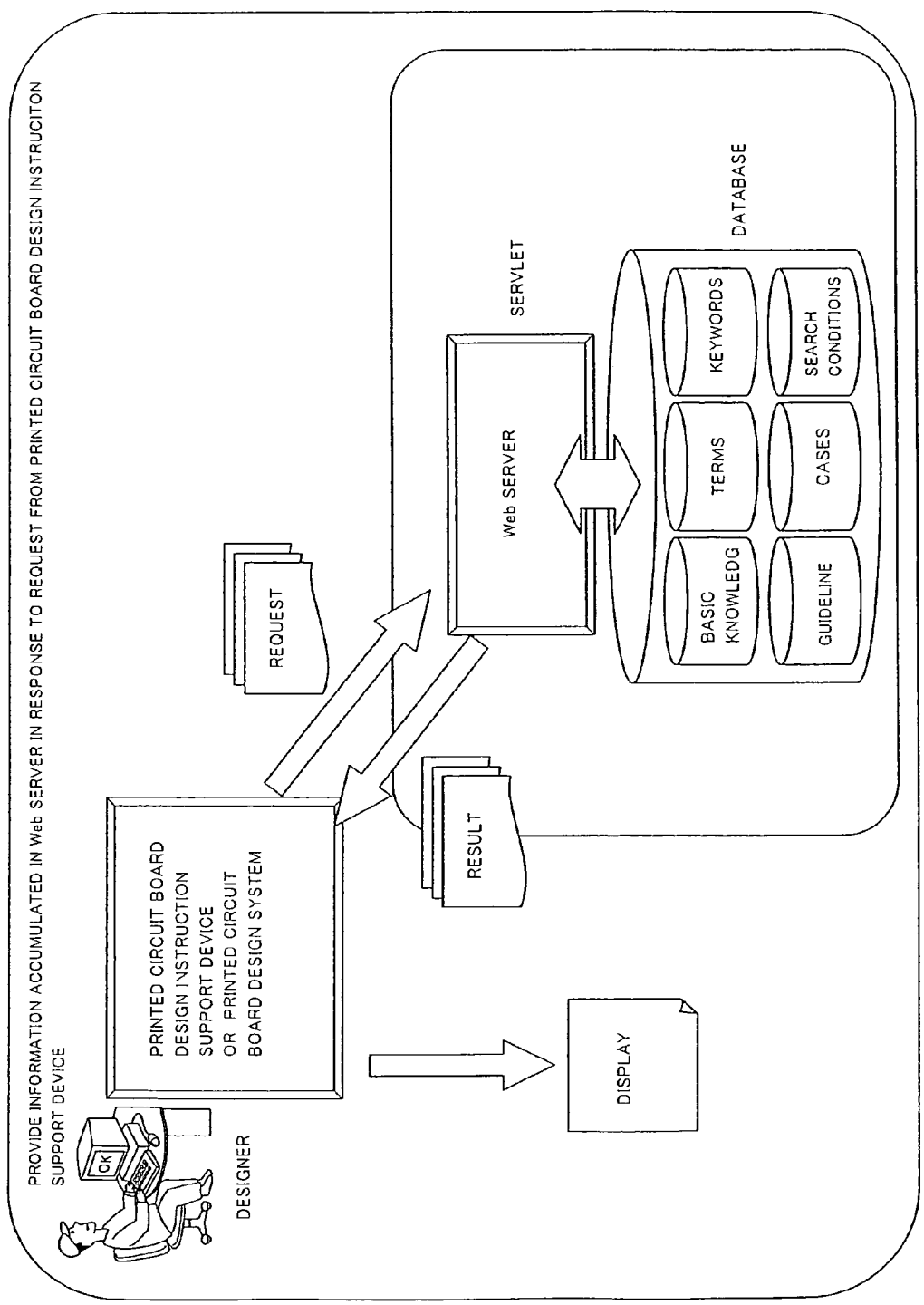
FIG. 14 is a conceptual view of a Web system of a printed circuit board design system cooperation type, which provides information accumulated in a Web server in response to a request from the printed circuit board design instruction support device.
Figure 15:
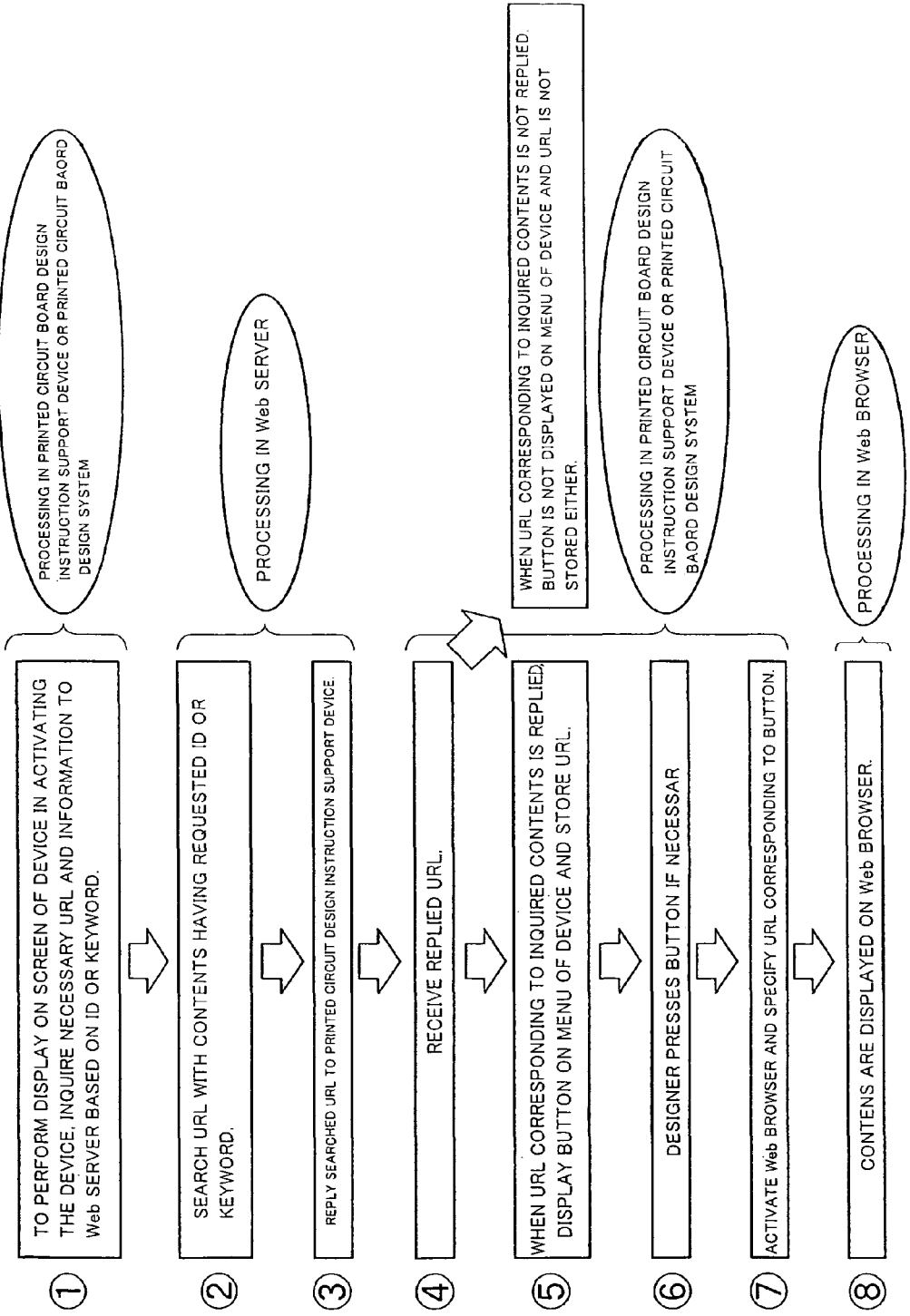
FIG. 15 is a flowchart showing the processing of the Web system of a printed circuit board design system cooperation type shown in FIG. 14.

FIG. 14 shows a conceptual view of a Web system of a printed circuit board design system cooperation type, which provides information accumulated in a Web server in response to a request from the printed circuit board design instruction support device, and FIG. 15 shows a flowchart showing the processing of the Web system of a printed circuit board design system cooperation type shown in the above-described conceptual view.

Description will be made with reference to the flowchart. In the Web system of a printed circuit board design system cooperation type, to perform display on the screen of the printed circuit board design instruction support device in activating the device first, the system inquires the Web server of URLs and character information, which are effective for a design system, based on an ID to acquire information from the Web server or keywords, terms, and part names from information regarding printed circuit board (circuit board specification, circuit board type, simulation information accumulated in manufacturing process and design process, and the like). At the same time, priority/condition setting is set in order to reply articles falling under the above-described conditions in proper contents of intended high-quality. Articles to which priorities are fixed are "data date (update level)", "access frequency", "access frequency of a particular person", "name who posted" and the like, and a conditional expression can be narrowed on a compound condition.

Next, an URL with contents having a requested ID or keywords is searched in the Web server, and a searched URL is replied to the printed circuit board design instruction support device while corresponding to the priority and condition setting if they are defined.

Next, in the printed circuit board design instruction support device, the replied URL and character information are received, and a button is displayed on the menu of the printed circuit board design instruction support device when a URL corresponding to the inquired contents is replied, and the URL is stored.

On the other hand, when a URL is not replied, the button is not displayed on the menu of the printed circuit board design instruction support device, and the URL is not stored either.

When a designer presses the button, the URL is passed to a Web browser simultaneously with the activation of the Web browser. Thus, necessary contents are displayed on the Web browser. Character information replied from the Web server is held in the printed circuit board design instruction support device, and displayed on a menu or a design screen in a proper design occasion.

Figure 16:
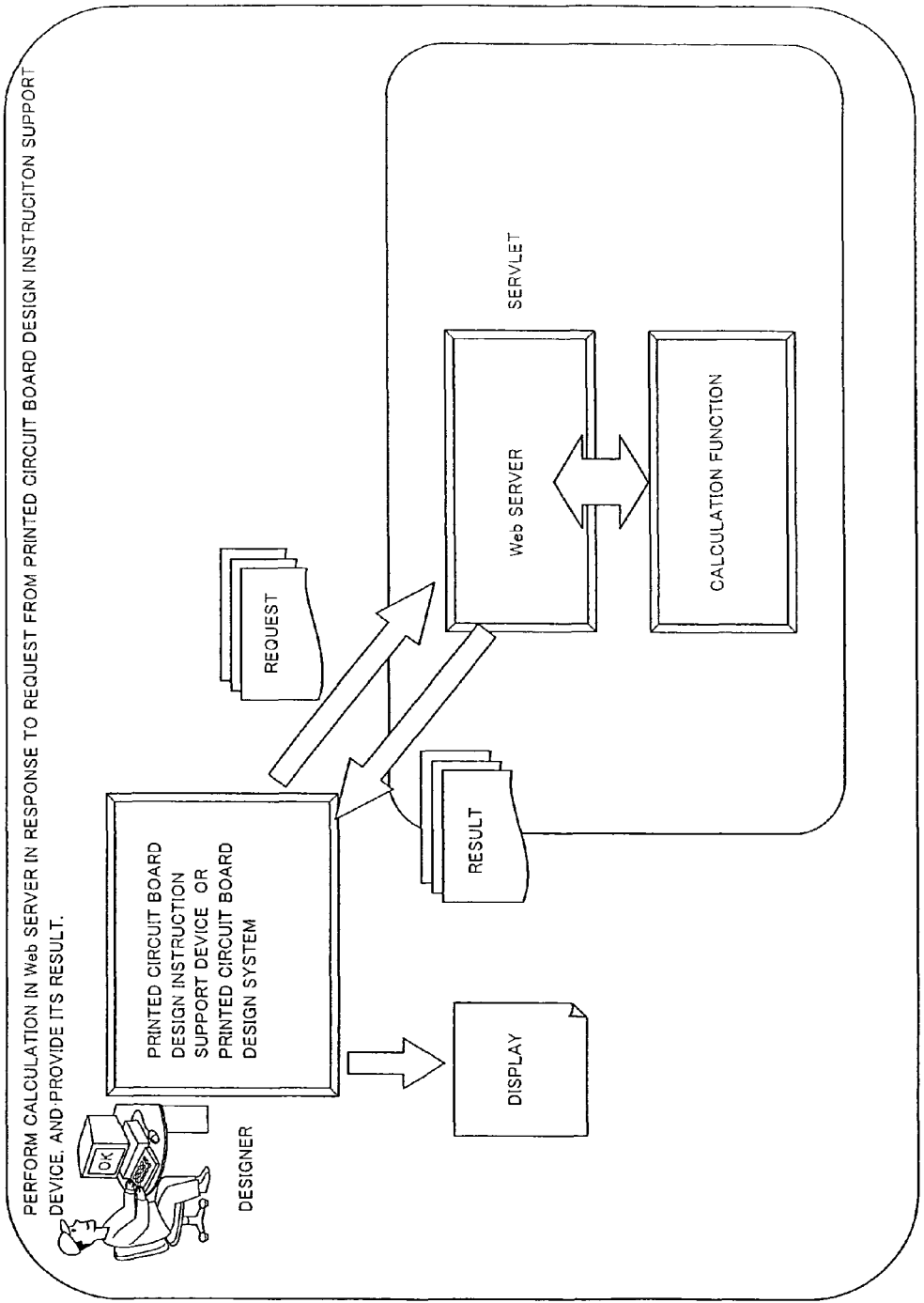
FIG. 16 is a conceptual view of the Web system of a printed circuit board design system cooperation type, which performs calculation in a Web server in response to a request from the printed circuit board design instruction support device and provides its result.
Figure 17:
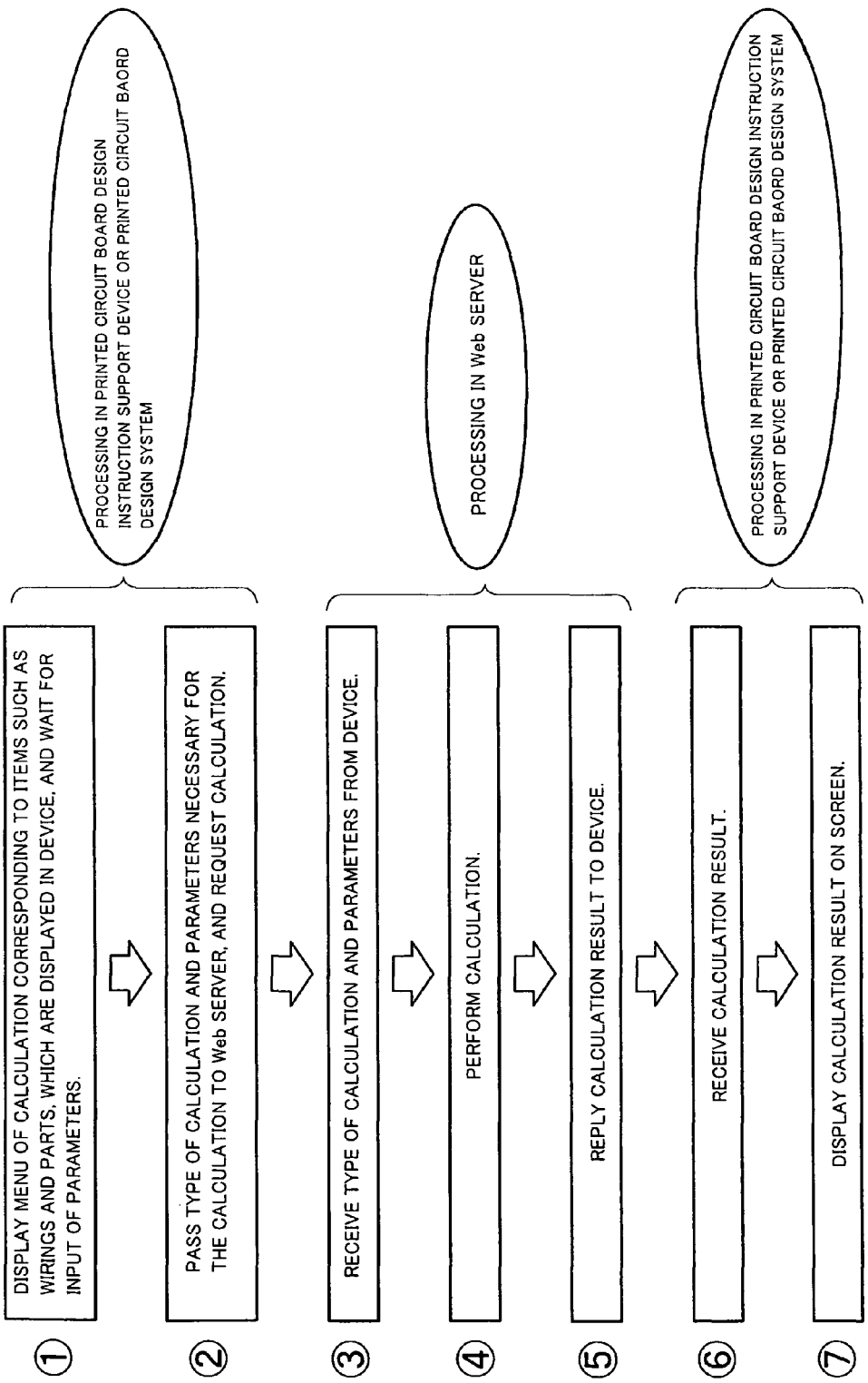
FIG. 17 is a flowchart showing the processing of the Web system of a printed circuit board design system cooperation type shown in FIG. 16.

Further, FIG. 16 shows a conceptual view of the Web system of a printed circuit board design system cooperation type, which performs calculation in the Web server in response to a request from the printed circuit board design instruction support device and provides its result, and FIG. 17 shows a flowchart showing the processing of the Web system of a printed circuit board design system cooperation type shown in the above-described conceptual view.

Description will be made with reference to the flowchart. In the Web system of a printed circuit board design system cooperation type, the menu of calculation corresponding to items such as wirings and parts displayed in the printed circuit board design instruction support device is displayed first, and the system waits for an input instruction of input parameters necessary for the calculation.

By inputting necessary parameters, general and auxiliary input parameters of a calculator, which are not prepared in the printed circuit board design instruction support device, are passed to the Web server to request calculation.

Next, in the Web server, the type of calculation and parameters from the printed circuit board design instruction support device are received, and the calculation result of numerical value or character string is replied to the printed circuit board design instruction support device after necessary calculation is performed.

In the printed circuit board design instruction support device, the calculation result is received to display the calculation result on the screen.

Figure 18:
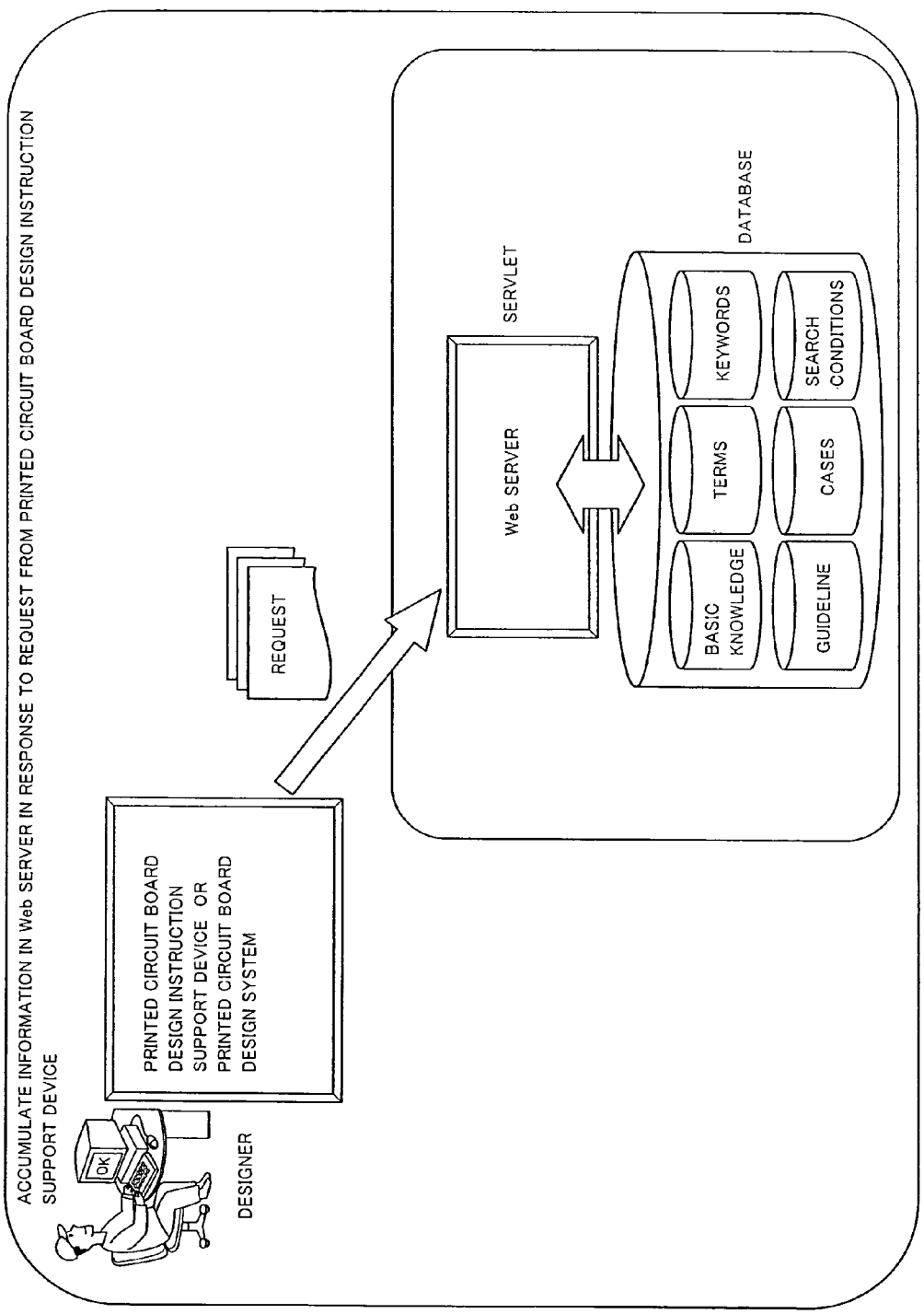
FIG. 18 is a conceptual view of the Web system of a printed circuit board design system cooperation type, which accumulates information in a Web server in response to a request from the printed circuit board design instruction support device.
Figure 19:
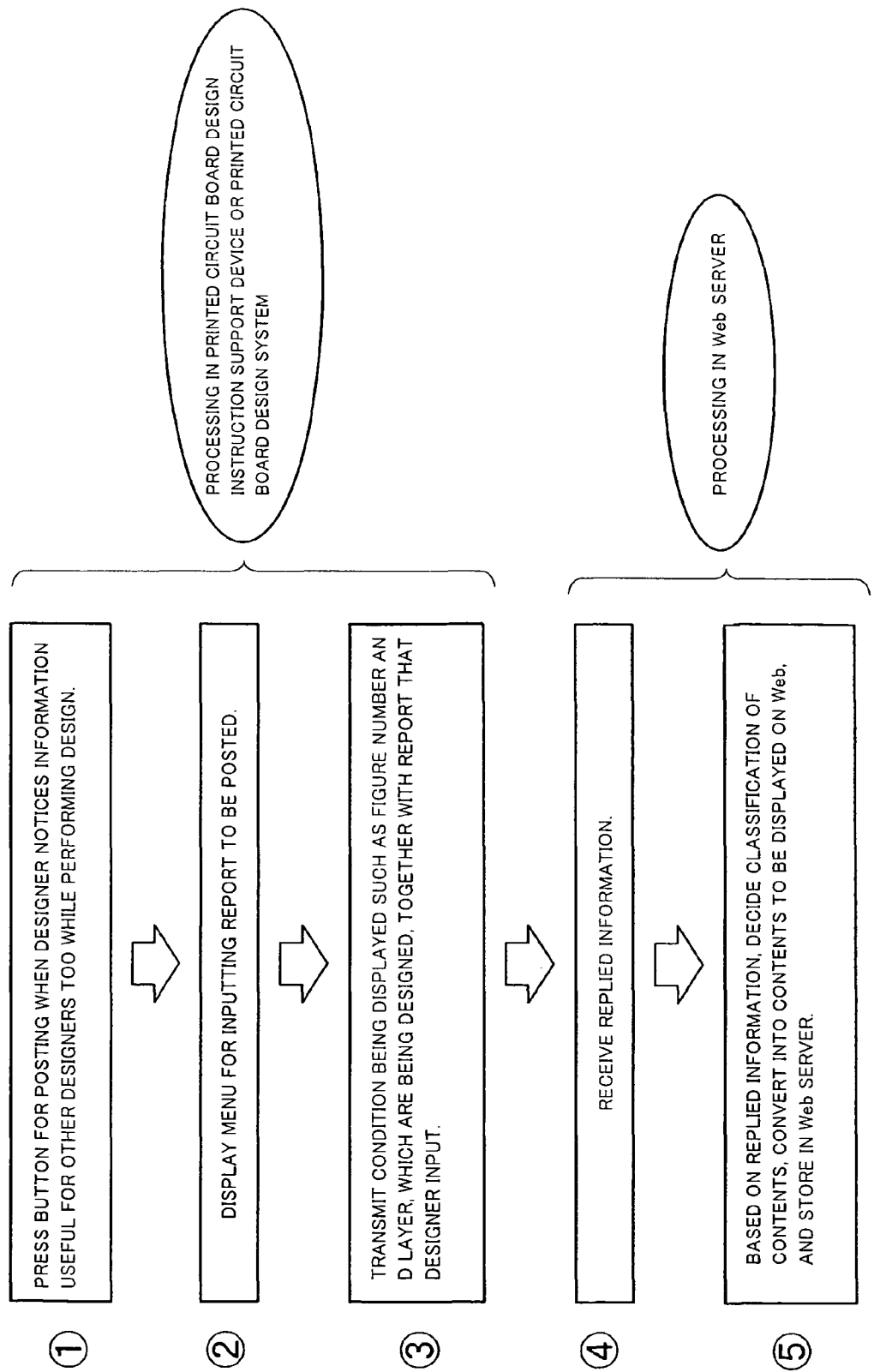
FIG. 19 is a flowchart showing the processing of the Web system of a printed circuit board design system cooperation type shown in FIG. 18.

Furthermore, FIG. 18 shows a conceptual view of the Web system of a printed circuit board design system cooperation type, which accumulates information in the Web server in response to a request from the printed circuit board design instruction support device, and FIG. 19 shows a flowchart showing the processing of the Web system of a printed circuit board design system cooperation type shown in the above-described conceptual view.

Description will be made with reference to the flowchart. In the Web system of a printed circuit board design system cooperation type, a button for posting is prepared in the printed circuit board design instruction support device first, and the designer presses the button for posting for the purpose of clearly stating cases and experience, screen explanation, and analysis information when he/she discovers or finds out information while performing design that could be useful in designing for other designers as well.

Then, a menu for inputting a report for posting is displayed, and when the designer inputs a report, the system transmits the input report together with a condition being displayed such as a figure number and a layer, which are being designed, to the Web server.

Next, in the Web server, the replied information is received, the classification of contents is determined based on the information, the contents are converted into contents that are made public and displayed on a Web, and stored in the Web server. By making the contents public, it is possible to get wide responses from the public or provide a "place" for exchanging information.

INDUSTRIAL APPLICABILITY

The present invention is used in the design work of a printed circuit board, and it can contribute to the improvement of the work efficiency of printed circuit board design and the improvement of the quality of printed circuit board design.

The invention claimed is:

1. A printed circuit board design instruction support device that supports printed circuit board design between a circuit design, and a printed circuit board design, said device comprising:

means for reading a circuit diagram designed by the circuit design;

means for storing design instruction information regarding the printed circuit board design and keywords, which are associated with said design instruction information and set corresponding to the type of items included in said circuit diagram;

means for extracting keywords corresponding to the type of items included in the read circuit diagram and automatically displaying design instruction information associated with the extracted keywords, when the circuit diagram is read by said reading means; and means for extracting damping resistances including the attribute of series connection from the circuit diagram read by said reading means, judging whether or not said resistances are dumping resistances by discriminating whether or not items connected to the pins of the extracted resistances are ICs, and automatically extracting damping resistances that are correctly arranged based on a design rule in arranging and target ICs of the resistances, from the circuit diagram read by said reading means, wherein said design instruction is made up of design implementation information showing information whether or not a circuit board designed was performed according to a design instruction and printed circuit board design instruction support implementation information to which check result information of printed circuit board design instruction support is input, and said storing means is database in which design instruction and said keywords are listed in a divided manner.

2. The printed circuit board design instruction support device according to claim 1, wherein said displaying means displays keywords corresponding to the type of items included in the read circuit diagram when the circuit diagram is read by said reading means, and said displaying means simultaneously displays said design instruction, said keywords, said items, said design implementation information and said printed circuit board design instruction support implementation information in a list.

3. The printed circuit board design instruction support device according to claim 1, said device comprising:

means for extracting capacitors, which are connected to a power source and ground, from the circuit diagram read by said reading means, judging whether or not said capacitors are bypass capacitors by discriminating whether or not the extracted capacitors are capacitors to which an IC is connected to the power source side, and automatically extracting bypass capacitors and target ICs of the capacitors from the circuit diagram read by said reading means.

4. The printed circuit board design instruction support device according to claim 3, wherein said extraction means when the extracted capacitors are connected to a plurality of ICs, extracts an IC having the shortest connecting distance out of the ICs.

5. The printed circuit board design instruction support device according to claim 3, wherein said extraction means extracts bypass capacitors, the target ICs of the capacitors, and the information of wiring connecting the both parts from the circuit diagram read by said reading means.

6. The printed circuit board design instruction support device according to claim 2, said device comprising:

means for extracting items included in the circuit diagram read by said reading means; and means for associating the items that were extracted by said extraction means with said design instruction information via said keywords, wherein said display means automatically displays correlation between the items associated by said association means, on the circuit diagram.

7. The printed circuit board design instruction support device according to claim 6, wherein said reading means reads a printed circuit board diagram designed by the printed circuit board design, said device comprising:

means for selecting items or keywords displayed by said display means; and means for highlighting regions of selected items on the printed circuit board diagram read by said reading means, which correspond to items selected by said selection means, by displaying in an enlarged manner when the items are selected by said selection means, and highlighting only items associated with the keywords on said printed circuit board diagram read by said reading means, which corresponds to keywords selected by said selection means, when the keywords are selected by said selection means, in performing cross-probe.

8. The printed circuit board design instruction support device according to claim 6, said device comprising:

means for selecting items or keywords displayed by said display means; and means for highlighting regions of selected items on said circuit diagram read by said reading means, which correspond to items selected by said selection means, by displaying in an enlarged manner when the items are selected by said selection means, and highlighting items associated with keywords on said circuit diagram read by said reading means, which correspond to keywords selected by said selection means, when the keywords are selected by said selection means, in performing cross-probe.

9. The printed circuit board design instruction support device according to any one of claims 7 and 8, said device comprising:

means for executing macro that performs control such that said display means displays the entire circuit diagram read by said reading means before items are highlighted by said highlight means, macro that performs control such that said display means displays highlighted items in an enlarged manner after the items were highlighted by said highlight means, or macro that performs control such that said display means displays the entire circuit diagram read by said reading means before items are highlighted by said highlight means and said display means displays highlighted items in an enlarged manner after the items were highlighted by said highlight means.

10. The printed circuit board design instruction support device according to any one of claims 1, 2, 3, 4, 5, 6, 7 and 8, said device comprising:

means for managing whether or not a printed circuit board design was performed according to said design instruction information, by accepting the input of a result in which said design instruction information was reflected on the printed circuit board design and accepting an agreement to said result, wherein said result is identifiably displayed on a display screen while the color and/or brightness of said items are changed and;

the device is capable of simultaneously displaying areas to be checked on both of a circuit diagram and a printed circuit board layout diagram for each circuit part.

11. A program for allowing a computer to function as the printed circuit board design instruction support device according to any one of claims 1, 2, 3, 4, 5, 6, 7 and 8.

12. A program for allowing a computer to function as the printed circuit board design instruction support device according to claim 9.

13. A printed circuit board design instruction support method in which printed circuit board design is supported between a circuit design and a printed circuit board design, said method comprising the steps of:

using a computer to execute the following steps;

reading a circuit diagram designed by the circuit design;

storing design instruction information regarding the printed circuit board design and keywords, which are associated with said design instruction information and set corresponding to the type of items included in said circuit diagram;

extracting keywords corresponding to the type of items included in the read circuit design and displaying design instruction information associated with the extracted keywords, when the circuit design is read by said reading step; and extracting damping resistances including the attribute of series connection from the circuit diagram, judging whether or not said resistances are damping resistances by discriminating whether or not items connected to the pins of the extracted resistances are ICs, and automatically extracting damping resistances that are correctly arranged based on a design rule in arranging and target ICs of the resistances, from the circuit diagram read, wherein said design instruction information is made up of design implementation information showing information whether or not a circuit board designed was performed according to a design instruction and printed circuit board design instruction support implementation information to which check result information of printed circuit board design support implementation is input, and said storing step is listing design instruction and said keywords in a divided manner.

14. A program for allowing a computer to function as the printed circuit board design instruction support device according to claim 13.

15. A computer-readable recording medium recording the program according to claim 11.

16. A printed circuit board design instruction support device supports printed circuit board design between a circuit design and a printed circuit board design, said device comprising;

means for reading a circuit diagram designed by the circuit design, means for storing design instruction information regarding the printed circuit board design and keywords, which are associated with said design instruction information and set corresponding to the type of items included in said circuit diagram;

means for extracting keywords corresponding to the type of items included in the read circuit diagram and automatically displaying design instruction information associated with the extracted keywords, when the circuit diagram is read by said reading means; and means for extracting capacitors, which are connected to a power source and ground, from the circuit diagram read by said reading means, judging whether or not said capacitors are bypass capacitors by discriminating whether or not the extracted capacitors are capacitors to which an IC is connected to the power source side, and automatically extracting bypass capacitors and target ICs of the capacitors from the circuit diagram read by said reading means, wherein said design instruction is made up of design implementation information showing information whether or not a circuit board designed was performed according to a design instruction awl printed circuit heard design instruction support implementation information to which check result information of printed circuit board design instruction support is input, and said storing means is database in which design instruction and said keywords are listed in a divided manner.

17. A printed circuit board design instruction support method in which printed circuit board design is supported between a circuit design and a printed circuit board design, said method comprising the steps of:

using a computer to execute the following steps;

reading a circuit diagram designed by the circuit design;

storing design instruction information regarding the printed circuit board design and keywords, which are associated with said design instruction information and set corresponding to the type of items included in said circuit diagram;

extracting keywords corresponding to the type of items included in the read circuit design and displaying design instruction information associated with the extracted keywords, when the circuit design is read by said reading step; and extracting capacitors, which are connected to a power source and ground, from the circuit diagram, judging whether or not said capacitors are bypass capacitors by discriminating whether or not the extracted capacitors are capacitors to which an IC is connected to the power source side, and automatically extracting bypass capacitors and target ICs of the capacitors from the circuit diagram, wherein said design instruction information is made up of design implementation information showing information whether or not a circuit board designed was performed according to a design instruction and printed circuit board design instruction support implementation information to which check result information of printed circuit board design support implementation is input, and said storing step is listing design instruction and said keywords in a divided manner.

* * * * *